(12) United States Patent
Grundmann et al.

(10) Patent No.: US 10,355,536 B1
(45) Date of Patent: Jul. 16, 2019

(54) WIRELESS POWER RECEIVER LOCALIZATION

(71) Applicant: X Development LLC, Mountain View, CA (US)

(72) Inventors: Michael Grundmann, San Jose, CA (US); Martin Schubert, Mountian View, CA (US)

(73) Assignee: X Development LLC, Mountain View, CA (US)

( * ) Notice: Subject to any disclaimer, the term of this patent is extended or adjusted under 35 U.S.C. 154(b) by 206 days.

(21) Appl. No.: 15/364,010

(22) Filed: Nov. 29, 2016

(51) Int. Cl.
*H02J 50/90* (2016.01)
*G01R 27/26* (2006.01)
*H02J 50/12* (2016.01)
*H02J 50/80* (2016.01)

(52) U.S. Cl.
CPC .......... *H02J 50/90* (2016.02); *G01R 27/2611* (2013.01); *H02J 50/12* (2016.02); *H02J 50/80* (2016.02)

(58) Field of Classification Search
CPC ....................................................... H02J 50/90
USPC ......................................................... 307/104
See application file for complete search history.

(56) References Cited

U.S. PATENT DOCUMENTS

| 2014/0171107 | A1 | 6/2014 | Kao et al. | |
|---|---|---|---|---|
| 2014/0191899 | A1* | 7/2014 | Pickle | G01S 13/726 342/175 |
| 2015/0073642 | A1* | 3/2015 | Widmer | G01C 21/3635 701/22 |

OTHER PUBLICATIONS

Robot Localization Using Inertial and RF Sensors, last accessed May 17, 2017, 84 pages, available at: https://etd.ohiolink.edu/letd.send_file?accession=miami1218571607&disposition=inline.

* cited by examiner

*Primary Examiner* — Joseph Chang
(74) *Attorney, Agent, or Firm* — McDonnell Boehnen Hulbert & Berghoff LLP

(57) ABSTRACT

Disclosed herein is a method of determining a location of a wireless power receiver. The method involves determining a first coupling coefficient between a transmitter and a receiver coupled via a wireless resonant coupling link, where the receiver is disposed at a first location. Further, the method involves receiving, by the transmitter, kinematic data generated by a sensor coupled to the receiver. Yet further, the method involves determining, based on the kinematic data and the first coupling coefficient, the first location.

23 Claims, 18 Drawing Sheets

| Operational States | Common Mode (Capacitive) | Differential Mode (Capacitive) | Inductive Mode |
|---|---|---|---|
| Operational State 1 | ON | OFF | OFF |
| Operational State 2 | OFF | ON | OFF |
| Operational State 3 | OFF | OFF | ON |
| Operational State 4 | ON | ON | OFF |
| Operational State 5 | OFF | ON | ON |
| Operational State 6 | ON | OFF | ON |
| Operational State 7 | ON | ON | ON |
| Operational State 8 | OFF | OFF | OFF |

FIG. 8

WIRELESS POWER RECEIVER LOCALIZATION

BACKGROUND

Unless otherwise indicated herein, the materials described in this section are not prior art to the claims in this application and are not admitted to be prior art by inclusion in this section.

Electronic devices, such as mobile phones, laptops, and tablets, have become an integral part of daily life. Other machines, such as cars, which have conventionally used non-electric power sources, are increasingly relying on electricity as a power source. As electronic devices are often mobile, it may not be feasible for devices to stay connected to a power source via wires. Thus, electronic devices may use batteries to supply electric power when a device is not coupled to a fixed power source.

Current battery technology, however, often does not meet the charge capacity and/or discharge rate demands of electronic devices, which may limit the range of moveable devices. Even in cases where batteries meet the power demands of a given device, such a device usually must be coupled to a fixed charging source via wires in order to recharge its battery. Such wired charging mechanisms may limit the movement, and thus the usability, of the device while it is being charged. Also, as the number of devices connected to a charging source increases, the number of wires in the proximity of an electrical outlet may increase, causing "cord clutter."

SUMMARY

According to an example implementation, a wireless power system may include a transmitter and a receiver that are disposed in an environment. The transmitter and the receiver may be coupled via a wireless resonant coupling link. The coupling coefficient of the wireless resonant coupling link may be used to determine values at which to set operating parameters of the system. In an embodiment, a controller of the system may estimate the coupling coefficient based on kinematic data that is generated by a sensor coupled to the transmitter and/or the receiver. The controller may also use the kinematic data and the coupling coefficient of the wireless power link to determine a pose of the transmitter and/or the receiver in the environment. As such, a wireless power system that includes a sensor that generates kinematic data may form a localization system that specifies the location of each device of the wireless power system.

In one aspect, a method is provided. The method involves determining a first coupling coefficient between a transmitter and a receiver coupled via a wireless resonant coupling link, where the receiver is disposed at a first location. Further, the method involves receiving, by the transmitter, kinematic data, where the kinematic data is generated by a sensor coupled to the receiver. Yet further, the method involves determining, based on the kinematic data and the first coupling coefficient, the first location.

In another aspect, a system is provided. The system includes a transmitter, and a receiver disposed at a first location, where the receiver is coupled to the transmitter via a wireless resonant coupling link, where the receiver is operable to receive electrical energy from the transmitter via the wireless resonant coupling link. The system also includes a sensor configured to generate kinematic data, where the sensor is coupled to the receiver. Further, the system includes one or more impedance matching networks. Yet further, the system includes a controller including at least one processor and a memory, where the at least one processor executes instructions stored in the memory so as to carry out operations, the operations including determining a first coupling coefficient between the transmitter and the receiver, receiving, by the transmitter, the kinematic data generated by the sensor. The operations also include determining, based on the kinematic data and the first coupling coefficient, the first location.

In yet another aspect, a method is provided. The method includes receiving, by a transmitter, kinematic data generated by a sensor coupled to a receiver, and where the receiver is coupled to the transmitter via a wireless resonant coupling link. The method also includes determining, based on the kinematic data, that at least one of the transmitter or the receiver has moved from a first location to a second location. Further, the method includes in response to the determination, determining a coupling coefficient between the transmitter and the receiver. Yet further, the method includes determining, based on the kinematic data and the coupling coefficient, the second location.

In yet another aspect, a system is provided. The system includes means for determining a first coupling coefficient between a transmitter and a receiver coupled via a wireless resonant coupling link, where the receiver is disposed at a first location. Further, the system includes means for receiving, by the transmitter, kinematic data, where the kinematic data is generated by a sensor coupled to the receiver. Yet further, the system includes means for determining, based on the kinematic data and the first coupling coefficient, the first location.

In yet another aspect, a system is provided. The system includes means for receiving, by a transmitter, kinematic data, where the kinematic data is generated by a sensor coupled to the receiver, and where the receiver is coupled to the transmitter via wireless resonant coupling link. The system also includes means for determining, based on the kinematic data, that at least one of the transmitter or the receiver has moved from a first location to a second location. Further, the system includes means for in response to the determination, determining a coupling coefficient between the transmitter and the receiver. Yet further, the system includes means for determining, based on the kinematic data and the coupling coefficient, the second location.

These as well as other aspects, advantages, and alternatives will become apparent to those of ordinary skill in the art by reading the following detailed description, with reference where appropriate to the accompanying drawings.

BRIEF DESCRIPTION OF THE DRAWINGS

FIG. 8 is a table illustrating modes of operation of a system, according to an example embodiment.

DETAILED DESCRIPTION

Figure 1:
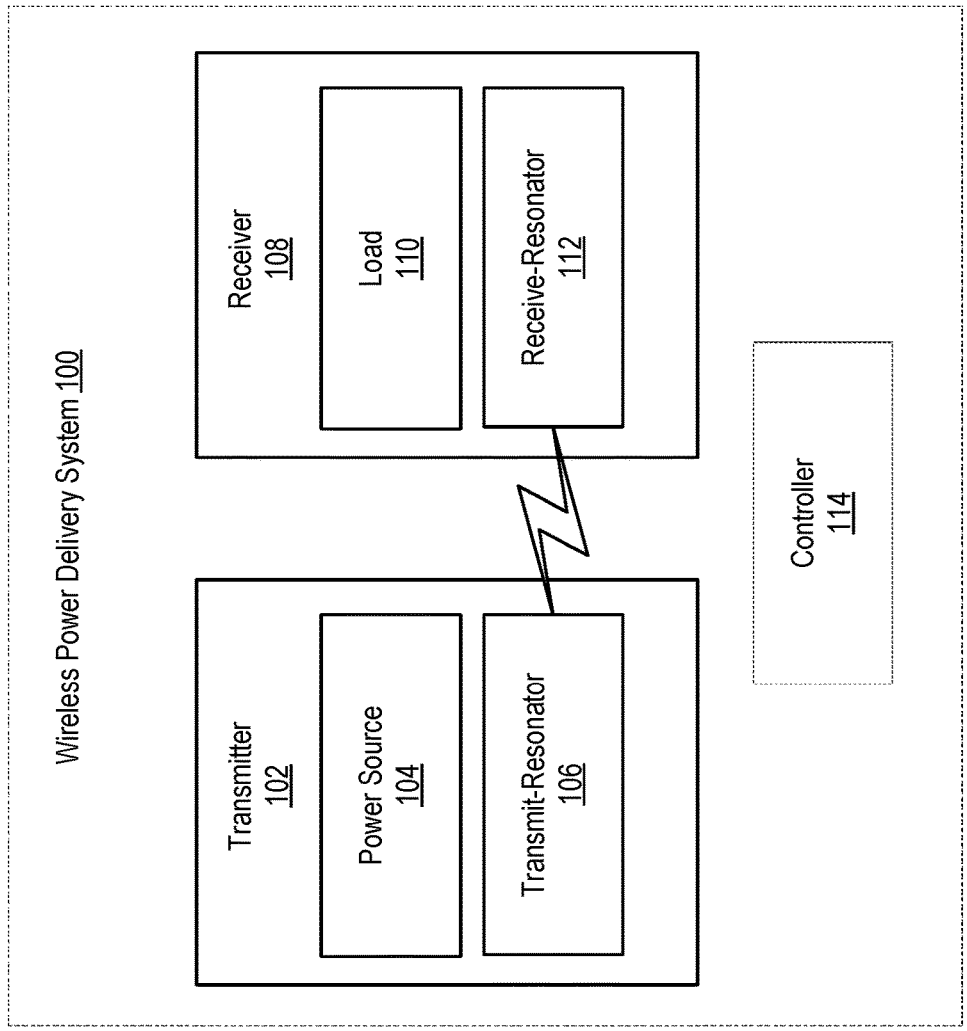
FIG. 1 is a functional block diagram illustrating the components of a wireless power delivery system, according to an example embodiment.

Exemplary methods and systems are described herein. It should be understood that the word "exemplary" is used herein to mean "serving as an example, instance, or illustration." Any embodiment or feature described herein as "exemplary" is not necessarily to be construed as preferred or advantageous over other embodiments or features. The exemplary embodiments described herein are not meant to be limiting. It will be readily understood that certain aspects of the disclosed systems and methods can be arranged and combined in a wide variety of different configurations, all of which are contemplated herein.

Furthermore, the particular arrangements shown in the Figures should not be viewed as limiting. It should be understood that other embodiments may include more or less of each element shown in a given Figure. Further, some of the illustrated elements may be combined or omitted. Yet further, an exemplary embodiment may include elements that are not illustrated in the Figures.

Furthermore, the term "capacitor" as used herein should be understood broadly as any system, including one or more elements, with a capacitive property. As such, the term "capacitor" may be used to refer to a lumped capacitive element and/or to a distributed capacitive element. Similarly, the term "inductor" as used herein should be understood broadly as any system, including one or more elements, with an inductive property. As such, the term "inductor" may be used to refer to a lumped inductive element and/or to a distributed inductive element.

I. Overview

A wireless power system may include a transmitter and a receiver that may be resonantly coupled via a wireless resonant coupling link. The magnitude of coupling between the transmitter and the receiver can be represented by a coupling factor k ("also referred to herein as a coupling coefficient"), which is a dimensionless parameter that represents the fraction of flux coupling the transmitter and the receiver. The k can be calculated based on parameters of the wireless power system. Such system parameters may include forward power that is transmitted by the transmitter, reflected power that is reflected from the receiver, impedances of elements of the system, etc.

A wireless power system may be configured to wirelessly transfer a specified amount of power from the transmitter to the receiver. A controller of the system may configure the operating parameters of the system such that the transmitter transfers the specified amount of power to the receiver. However, a change in the configuration of the system, e.g., a movement of the receiver, may require the controller to recalculates the operating parameters in order to maintain the amount of power transferred to the receiver at the specified level.

In an embodiment, the controller of the wireless power system may adjust an impedance of impedance matching networks located in the system in order to improve an impedance mismatch between the transmitter and the receiver. Adjusting the impedance of the impedance matching networks may affect the amount of power that is received at the receiver. Therefore, when the receiver moves, the controller may determine an adjustment to the impedance of the impedance matching networks in order to account for the movement. Preferably, the adjustment causes the transmitter to maintain the transfer of power to the receiver at the specified amount.

However, in order to determine the impedance at which to tune the impedance matching networks, the system may need to determine the coupling coefficient of the wireless resonant coupling link, among other system parameters. Such a calculation, which may be based on reflected impedance from the receiver, may consume large amounts of time and processing resources. This may result in squandered power as the transmitter may transfer power inefficiently while the system determines the coupling coefficient. Furthermore, the coupling coefficient may rapidly change as the receiver moves, which may make it difficult for the controller to rapidly tune the impedance matching networks as the receiver moves.

Disclosed herein is a method and system that accelerates that rate at which the system determines the system parameters. Such a method may be implemented when the configuration of the system changes and the system needs to determine the system parameters for the new configuration. For example, the method may be implemented when a receiver moves in an environment to accelerate the rate at which the impedance matching networks of the system are tuned.

In an embodiment, the receiver may include an inertial measurement unit (IMU) that measures parameters of the receiver. The controller may use the IMU data to detect a movement of the receiver in the environment. Once the controller detects the movement, the controller may estimate the new coupling coefficient between the transmitter and the receiver, subsequent to the receiver's movement. In particular, the controller may estimate the new coupling coefficient using a correlating function that correlates the relative change in position of the receiver to a relative change in coupling coefficient. The controller may determine, based on the IMU data, the relative change in position of the receiver from the position of the receiver prior to the movement to the position of the receiver subsequent to the movement. The controller may then use relative change in position and the correlating function to determine a change in the coupling coefficient of the wireless resonant coupling link from the coupling coefficient prior to the receiver's movement to the coupling coefficient subsequent to the receiver's movement.

The calculation to estimate the coupling coefficient may be performed more rapidly than the calculation of determining the coupling coefficient based on reflected impedance. As such, estimating the coupling coefficient may allow the controller to accelerate the determination of the impedance at which to tune the impedance matching networks. This further allows the controller to rapidly tune the impedance matching networks such that the transmitter maintains the transfer of power to the receiver at the specified amount, and the receiver therefore does not experience a significant drop in electrical power.

II. Example Systems and Operation

An example system 100 for wireless transfer of power is shown in FIG. 1. The system 100 may include various subsystems, elements, and components as described below. One or more subsystems may include a controller configured to carry out one or more of a variety of operations. In accordance with example embodiments, a controller may include one or more processors, memory, and machine language instructions stored in the memory that when executed by the one or more processors cause the controller to carry one or more of its controlling functions or operations. A controller may also include one or more interfaces for device control, communications, etc.

In further accordance with example embodiments, various functions and operations described below may be defined as methods that may be carried within the system, where at least some aspects of the methods can be implemented based on functions and/or operations carried out by one or more controllers and/or one or more of processors. Other aspects of the methods may be carried out by other elements or components of the system, under control of one or another controller, in response to environmental factors, or in response to receiving or detecting a signal, for example.

In an example embodiment, a wireless power delivery system may include a power source configured to wirelessly deliver power to a load via a transmitter and a receiver. As shown in FIG. 1, system 100 may include a transmitter 102 and a receiver 108, both of which may be considered subsystems of system 100, and a controller 114. For the sake of brevity in FIG. 1 and elsewhere herein, control functions and operations are generally described as being carried out only by the controller 114. Thus, controller 114 may be viewed conceptually as a unified control function. It should be understood, however, that as subsystems of system 100, the transmitter 102 and receiver 108 may each include its own controller, as described elsewhere herein. Alternatively or additionally, the controller 114 may include a distributed computing system, e.g., a mesh network.

As such, the various control functions and operations attributed to controller 114 may be implemented across one or more controllers, such as ones included (but not shown) in transmitter 102 and receiver 108. For example, an operation described as being carried out by the transmitter could be done so under control of a controller in the transmitter. Similarly, an operation described as being carried out by the receiver could be done so under control of a controller in the receiver.

In addition to each of the transmitter 102 and receiver 108 possibly including its own controller, each of them may also include and/be constructed of various types of electrical components. For example, electrical components may include circuit elements such as inverters, varactors, amplifiers, rectifiers, transistors, switches, relays, capacitors, inductors, diodes, transmission lines, resonant cavities, and conductors. Furthermore, the electrical components may be arranged in any viable electrical configuration, such as lumped or distributed.

Returning to FIG. 100, the transmitter 102 of system 100 may include a transmit-resonator 106. The transmit-resonator 106 may have a high Q value and may be configured to resonate at one or more resonant frequencies. Transmitter 102 may be coupled with power source 104, which may be configured to supply transmit-resonator 106 with a signal oscillating at one of the transmit-resonator resonant frequencies. In an example, the power source 104 may include a power oscillator to generate the oscillating signal, which may be oscillating at one of the transmit-resonator resonant frequencies. The power oscillator may be powered by a power signal received from an electrical outlet. For example, the electrical outlet may supply the power source 104 with an AC voltage of 120 V at a frequency of 60 Hz. In other examples, the power source may include a converter that may use a power from a power signal, which may have a low-frequency (i.e. 60/50 Hz), to generate a carrier signal that has an oscillation frequency of one of the transmit-resonant frequencies. The carrier signal may be modulated to carry the power signal and may thus be the oscillating signal supplied by the power source 104.

Furthermore, the resonant frequency $\omega_0$ at which the signal may oscillate, also called the system resonant frequency, may be chosen by controller 114 of system 100. Transmit-resonator 106 may resonate, upon receiving the oscillating signal from source 104, and consequently, may generate a field oscillating at the system resonant frequency.

Receiver 108 may include a receive-resonator 112. The receive-resonator 112 may have a high Q value and may also be configured to resonate at the system resonant frequency. The receiver 108 may also include a load 110. Thus, if receive-resonator 112 is in the range of the oscillating field (i.e., the field penetrates receive-resonator 112), resonator 112 may wirelessly couple with the oscillating field, thereby resonantly coupling with transmit-resonator 106. Receive-resonator 112, while resonating, may generate a signal that may be delivered to the load 110. Note that in the implementation where the oscillating signal generated by the power source 104 is a modulated carrier signal (generated by a converter), the receiver 108 may include a filter network. The filter network may be used to isolate the power signal from the modulated carrier signal. The power signal (i.e., 50/60 Hz signal) may then be delivered to the load 110.

In example systems, there may be more than one receiver. This is described below in further detail.

Figure 2:
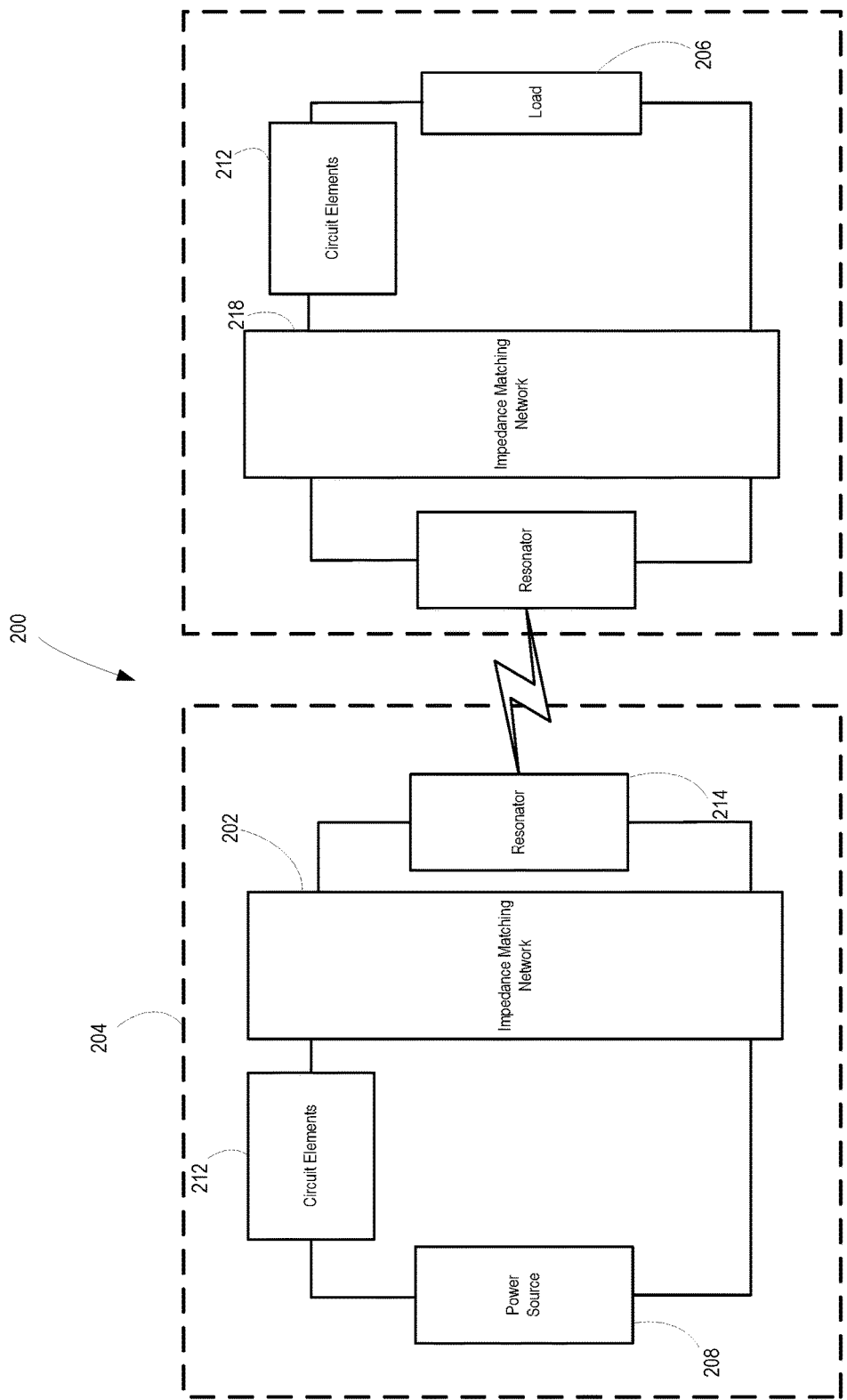
FIG. 2 is a functional block diagram illustrating an impedance matching circuit coupled to a transmitter, according to an example embodiment.

Wireless power delivery systems may include at least one impedance matching network configured to increase the efficiency of wireless power transfer. FIG. 2 illustrates an impedance matching network in a system, according to an exemplary embodiment. As illustrated in FIG. 2, the impedance matching network 202 is coupled to the transmitter 204. Further, the impedance matching network 202 may be in series, parallel, or in any other configuration with the transmit-resonator 214. In some embodiments, an impedance matching network 218 may additionally and/or alternatively be coupled to the receiver. Furthermore, the impedance matching networks 202 and 218 may each include any combination of L matching networks, pi networks, T networks, and/or multi-section matching networks.

In some embodiments, the system may deliver a determined power to the load by configuring the impedance matching network to operate at a determined impedance. In particular, a controller of the system may determine a power to deliver from the transmitter to the load. The controller may use at least the reflected impedance, from the load to the transmitter, to determine the impedance that the impedance matching network(s) may be configured to match. Accordingly, the system may deliver the determined power to the load when the impedance matching network matches the determined impedance.

More specifically, the controller of the system may generate a model, such as a SPICE model, of the system to determine the impedance that the impedance matching network may match. The model may include known values such as the actual impedance of the load, which the controller may receive from the receiver using methods described herein. However, the controller may need to determine the actual power supplied to the load from the transmitter and the reflected impedance (from the load to the transmitter) in order to fully characterize the model of the system (e.g., to derive the coupling factor k). The controller may use the fully characterized model of the system to dynamically impedance match by precisely determining the impedance that the impedance matching circuit may match.

In an embodiment, the system may include a bidirectional coupler, which may be used to determine the actual power supplied to the load from the transmitter and the reflected impedance from the load to the transmitter. The bidirectional coupler may be used in conjunction with a computer and/or a controller to precisely solve for an impedance of the load connected to it. The bidirectional coupler may also be used, in conjunction with a computer and/or a controller, to precisely solve for the amount power leaving the power source. The value of the reflected impedance of a load and the amount power leaving the source may be used to adjust the impedance matching network. Accordingly, the system may be configured to dynamically impedance match in a single step by using the bidirectional coupler to determine the actual power supplied by the source and the reflected impedance from the load to the transmitter.

However, the value of the reflected impedance from the load may change due to different factors, such as a change in the coupling between a transmitter and a receiver. The coupling between a transmitter and a receiver may change due to various factors, such as a change in the distance between the transmitter and the receiver. For example, the receiver may move during power transfer, which may change the coupling between the transmitter and the receiver. Such relative movement may change the reflected impedance of the load. Accordingly, as the reflected impedance from the load to the transmitter changes, the controller may be configured to continuously or intermittently solve for the actual power delivered to the load and the reflected load impedance, in order to dynamically impedance match.

Figure 3:
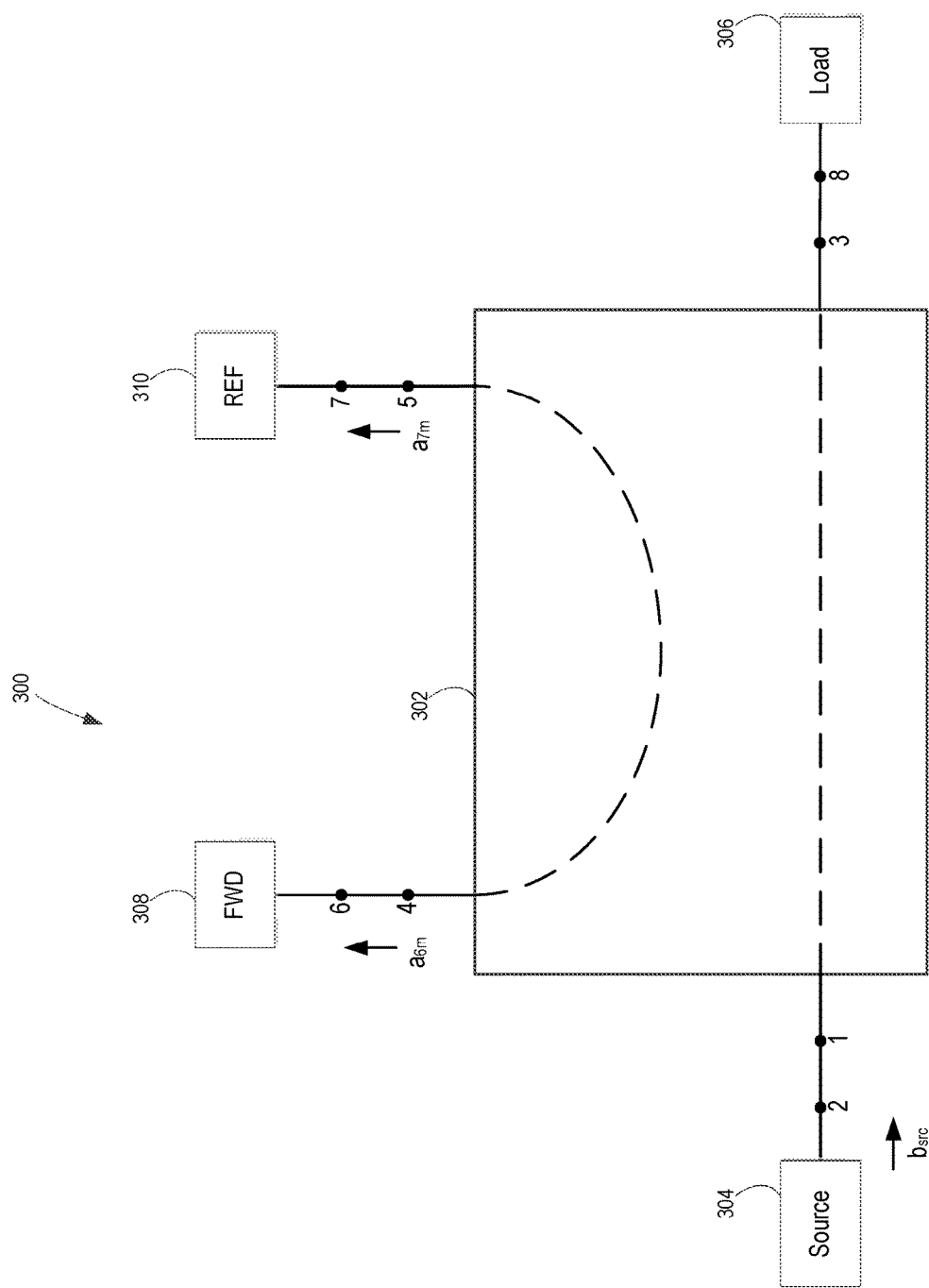
FIG. 3 is a diagram illustrating a representation of a bidirectional coupler used in a mathematical derivation, according to an example embodiment.

FIG. 3 illustrates a network representation of a system, including the bidirectional coupler 302 that is coupled in cascade between a power source 304 and a load 306, according to an exemplary embodiment. As illustrated in FIG. 3, the bidirectional coupler may be coupled between the power source at port 2 and the rest of the system (lumped into load 306) at port 8. Generally, there may be forward and reflected power waves at each port of the bidirectional coupler (ports 1, 3, 4, and 5). The forward and reflected waves, and thus the power and impedance, at each port, may be precisely determined by fully characterizing the RF properties of the bidirectional coupler. For instance, a mathematical relationship between the incoming and outgoing waves on each of the bidirectional coupler 302's ports may be used to precisely calculate the power delivered to the load 306 and the load 306's reflected impedance back to the source 304. The mathematical relationship may use an S-parameter characterization of the bidirectional coupler 302 to relate between the incoming and outgoing waves on each of the bidirectional coupler 302's ports.

The bidirectional coupler 302 may operate by coupling forward power from port 1 to port 3. An attenuated forward power may be coupled to port 4 and sampled at measurement FWD port 6. Additionally, a small amount of forward power may also be coupled into port 5 and measured at REF port 7. Likewise, reflected power is coupled from port 3 to port 1, and an attenuated power may be coupled to port 5 and sampled at measurement REF port 7. Additionally, a small amount of reflected power may be coupled into port 4 and measured at FWD port 6. Despite these non-idealities, of the forward power coupling to port 5 and the reflected power coupling to port 4, a computer and/or a controller may precisely calculate the power delivered to the load 306 and the load 306's reflected impedance. The controller may use premeasured values and values measured in real-time in order to solve for the unknown values of the mathematical relationship between the reflected power waves, the incident power waves, and the bidirectional coupler's S-parameter matrix.

The premeasured values of the mathematical relationship (A) may include a 4×4 S-parameter matrix and the input reflection coefficient, an S-parameter, of power source 302. Further, the non-idealities in the operation of the bidirectional coupler may be accounted for by premeasuring the 4×4 S-parameter matrix of the bidirectional coupler 302. In some embodiments, the S-parameters may be premeasured using a vector network analyzer (VNA). The measured S-parameters may be stored in a lookup table that a controller of system 300 may have access to.

Further, as explained above, the bidirectional coupler 302 may be used to periodically make real-time measurements of waves that may be used to solve for the power delivered to the load 306 and the load 306's reflected impedance. Specifically, in order to precisely calculate the power delivered to the load 306 and the load 306's reflected impedance, both the absolute magnitude of the power signals at ports 6 and 7 may be measured along with the phase of each signal with respect to the other. FWD and REF may include any measurement device or circuitry capable of measuring signals, e.g., an ammeter, a voltmeter, a spectrum analyzer, etc. Furthermore, FWD and REF may send information indicative of the respective measured signals to the controller of the system.

Furthermore, certain configurations of network 300 may simplify the S-parameter characterization of the bidirectional coupler 302. By design, FWD 308 and REF 310 may be impedance matched to the transmission line that carries the signals to each port to prevent signals from reflecting when measured at each port. For example, FWD port 308 and REF port 310 may be 50Ω terminated when a transmission line that has characteristic impedance ($Z_0$) of 50Ω is used to carry the signal to each port.

Accordingly, a controller of a wireless power delivery system may use a bidirectional coupler to solve for the reflected impedance of the load and the power delivered to the load. The system may use the solved for values in the model of the system to fully characterize the system. As such, at least the coupling factor k may be calculated. Further, the controller may use the model of the system to predict the amount of power that may be delivered to a load by adjusting the impedance that the impedance matching circuit may match.

Further, the controller may periodically measure the reflected impedance of the load and the power delivered to the load, according to a predetermined time period, which may range from microseconds to tens of seconds in length. After each measurement, the controller may periodically adjust at least one impedance matching network of the system. In an example, a controller may measure the reflected impedance and may accordingly adjust an impedance matching network every millisecond using the method described above. Other time intervals are possible. Alternatively, the controller may measure the reflected impedance of the load and the power delivered to the load continuously. In such a scenario, the controller may continuously adjust an impedance matching network of the system to deliver a determined power to the load.

In some embodiments, the wireless power delivery system may include a plurality of receivers coupled to a single transmitter with a single bidirectional coupler. In such a scenario, each receiver may reflect a signal to the transmitter due to a possible impedance mismatch at each load coupled to each receiver. The controller may use the measured values to fully characterize the system in order to determine an impedance that the impedance matching network may match.

In some embodiments, a plurality of receivers may be coupled to a single bidirectional coupler. The bidirectional coupler may use time-division multiplexing (TDM) to send the reflected signal of each receiver to the measurement device during a given interval of time. The controller may then use the method described above to solve for the reflected impedance of each load coupled to each respective receiver.

The controller of the system may adjust at least one impedance matching circuit based on the measured values. In an example embodiment, a system with a plurality of receivers may include an impedance matching network coupled to the transmitter and/or to each of the receivers. However, as the transmitter may receive different reflected impedances from each load, it may not be possible for the controller to adjust the impedance matching network to simultaneously match the reflected impedance of each receiver and the impedance of the power source. Accordingly, in some embodiments, the controller may adjust at least one impedance matching network of the impedance matching networks coupled to each of the receivers. In other embodiments, the controller may adjust the impedance matching network, coupled to the transmitter, to match the reflected impedance of a selected receiver from the plurality of receivers. As such, the selected receiver, whose reflected impedance was matched at the impedance matching network, may proportionately receive more power than the other receivers in the system. In some embodiments, wireless power delivery to the selected receiver may be more efficient than such power delivery to other receivers of the plurality of receivers.

In other examples, a system with a plurality of receivers may perform impedance matching according to time-division (TDM) and/or frequency-division (FDM) multiplexing. For instance, in a TDM scheme, each receiver may be configured to couple to the transmitter with a single impedance matching network during a specific time interval. The system may receive a reflected signal from a receiver during the specific time interval that the receiver is coupled to the transmitter. In such a scenario, the controller may adjust the impedance matching network such that each receiver may receive maximum power during the interval that the receiver is coupled to the transmitter. In an example embodiment, each receiver of the plurality of receivers may be assigned a respective time slot according to a receiver priority or a receiver order. The time slots may be equal in duration, but need not be equal. For example, receivers with higher receiver priority may be assigned to longer time slots than those receivers with a lower receiver priority.

In a FDM scheme, each receiver may be configured to couple to the transmitter with on a specific respective frequency. The system may receive a respective reflected signal from each receiver on the specific frequency that the receiver is coupled to the transmitter on. In such a scenario, the controller may adjust the impedance matching network(s), which may be connected to the transmitter and/or to each of the receivers, such that each receiver may receive a determined amount of power.

In yet another example of a system with a plurality of receivers, a controller may determine the power that each receiver may receive simultaneously from the transmitter by adjusting the impedance matching network. Specifically, the impedance of the impedance matching network may determine, at least in part, the amount of power that each receiver may receive. For example, each receiver may receive power based on at least a difference between the receiver's impedance and that of the impedance matching network. Accordingly, the controller may adjust the impedance matching network so as to increase or decrease an amount of power delivered to a respective receiver, based at least on the receiver's impedance.

A controller may determine the amount of power that each receiver may receive from the transmitter based on various parameters. In an example embodiment, each receiver may be associated with a respective priority such that higher priority receivers may receive more power during a single power distribution cycle than lower priority receivers. In other examples, a current charging state of the receiver (if the receiver is coupled to a load that includes a battery), may determine the amount of power that a receiver may receive. That is, a receiver with a low battery level may receive higher priority than a receiver with a full battery. It is understood that the controller may distribute power to each receiver of the plurality of receivers based on a variety of other parameters.

Within examples, a controller may receive information indicative of at least one parameter from a receiver when authenticating the receiver. As such, the controller may generate a dynamic priority list based on the received information. In an example embodiment, the dynamic priority list may be updated when a receiver connects or disconnects from a transmitter. Further, a controller may store the received information and the corresponding dynamic priority lists either locally or on a server. In other examples, a receiver may send a controller updated information if a parameter of the receiver changes after the initial synchronization process. In other examples, a controller may periodically query a receiver, via a side-channel communication link, for example, to request information regarding the state of the receiver. As such, the controller may receive, via the side channel, for example, information such as the current charging state of a battery of a receiver or the current power requirements of a receiver.

In yet other examples, a system may include one or more impedance matching networks in each receiver of the plurality of receivers. A system may additionally or alternatively include impedance matching networks in the transmitter and at least one of the receivers. In such scenarios, a controller may be configured to adjust a plurality of impedance matching networks of the system such that each receiver may receive a determined amount of power from the transmitter.

Additionally or alternatively, the system may use the dynamic impedance matching method described above to detect a parasitic receiver. Specifically, a controller of the system may use information, such as nominal impedance, about authorized receivers to generate a circuit model of at least a portion of the wireless power delivery system. Additionally or alternatively, the controller may generate the circuit model based on an approximation, estimation, or other determination of a coupling condition between the transmitter and the receiver, which may be based on their relative locations. Based on the circuit model, the controller may calculate an ideal power reception amount that it may receive from each receiver. Accordingly, the controller may compare the calculated ideal power received and the actual power received. If the ideal and actual powers received are not equal within a specified margin of error, the controller may determine that a parasitic device may be present in the system. For example, the controller may determine that a parasitic device may be present in the system if the value of the calculated power received varies by more than 10% of the value of the actual power received. Additionally or alternatively, the controller may use other methods disclosed herein to identify parasitic receivers.

A. Coupling Modes

A transmitter and a receiver of a wireless power delivery system may establish a wireless coupling resonant link, and thus become resonantly coupled, via various coupling modes. Each coupling mode is associated with a type of resonator that may be included in a transmitter and/or a receiver. Accordingly, a system may excite a type of resonator so as to provide a wireless resonant link via the associated coupling mode. Furthermore, the system may maintain multiple wireless resonant links of different coupling mode types at any given time. Within examples, a transmitter and a receiver of a system may include at least one of three resonator types. As such, the operational state of a system may utilize at least one of three resonant coupling modes.

Figure 4A:
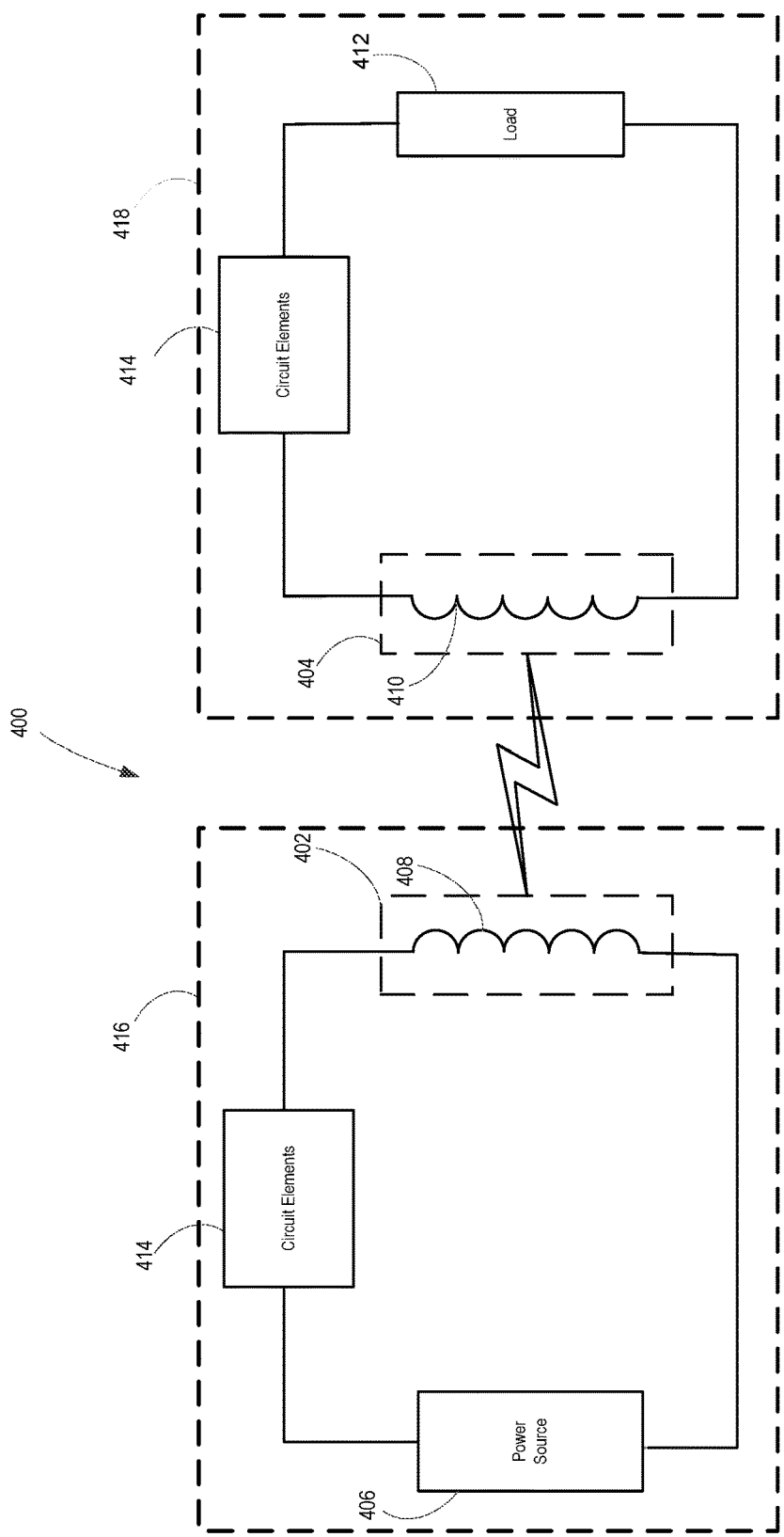
FIG. 4A to 4B illustrate a simplified circuit diagram of inductive resonant coupling, according to an example embodiment.
Figure 4B:
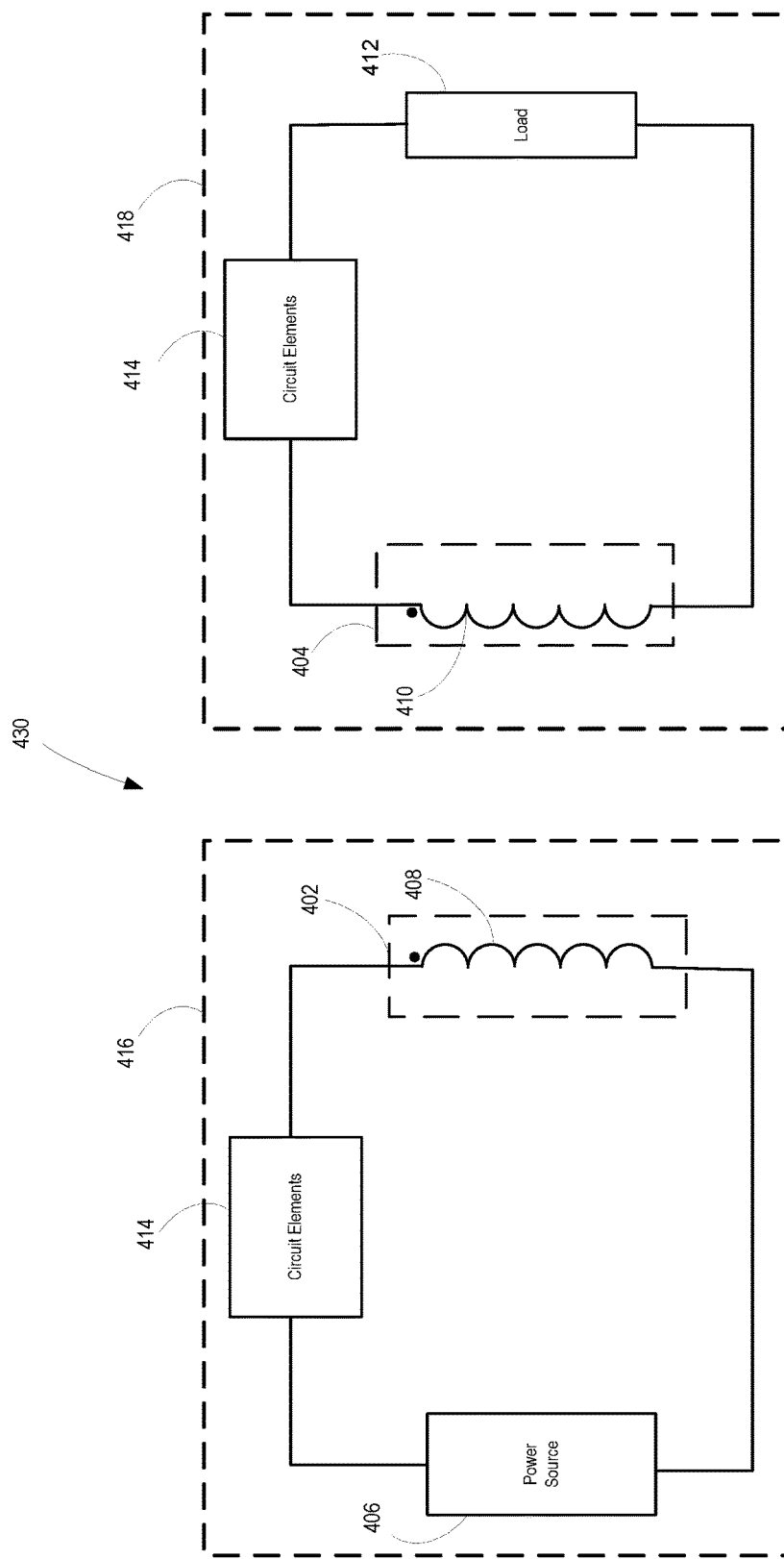

FIG. 4A and FIG. 4B illustrate an inductive resonant coupling mode, the first coupling mode, according to an exemplary embodiment. Each of transmit-resonator 402 and receive-resonator 404 may include at least an inductor. Further, each resonator may be configured to resonate at least at the system resonant frequency of system 400. Transmit-resonator 402 may resonate upon receiving a signal, from power source 406, that is oscillating at the system resonant frequency. Thus, transmit inductor 408 of transmit-resonator 402 may generate a magnetic field oscillating at the system resonant frequency. Receive-resonator 404 may couple with the oscillating magnetic field if it is within proximity to the transmit-resonator 402. As a result, a wireless coupling resonant link may be established. Coupled receive-resonator 404 may then resonate, and may therefore generate a signal that may be delivered to load 412.

Additionally or alternatively, the system may include a transmitter and/or a receiver that include a capacitive resonator, which may be operable to couple the transmitter and the receiver. In an example embodiment, each of the transmitter capacitive resonator and the receiver capacitive resonator may include at least a capacitor. The transmit-resonator may resonate upon receiving, from the power source, a signal oscillating at the system resonant frequency. As the transmit-resonator resonates, the capacitor of the transmit-resonator may generate an electric field oscillating at the system resonant frequency. The receive-resonator, if in proximity to the transmit-resonator, may couple with the oscillating electric field; thereby establishing a wireless coupling link between the transmitter and the receiver. As such, the receive-resonator may resonate, and may therefore generate a signal that may be delivered to a load coupled to the receiver.

In an example embodiment, a system may include at least one of two types of capacitive resonators, each of which may be associated with a respective coupling mode. The two capacitive resonators differ in the configuration of their respective capacitors. The first capacitive resonator may include a common mode capacitor, which may support a capacitance between a single conductor and ground. A common mode capacitive resonator may be operable to provide a wireless coupling link via a coupling mode termed common mode. The second capacitive resonator type may include a differential mode capacitor, which may support a capacitance between two conductors. A differential mode capacitive resonator may be operable to provide a wireless coupling link via a coupling mode termed differential mode.

Figure 5A:
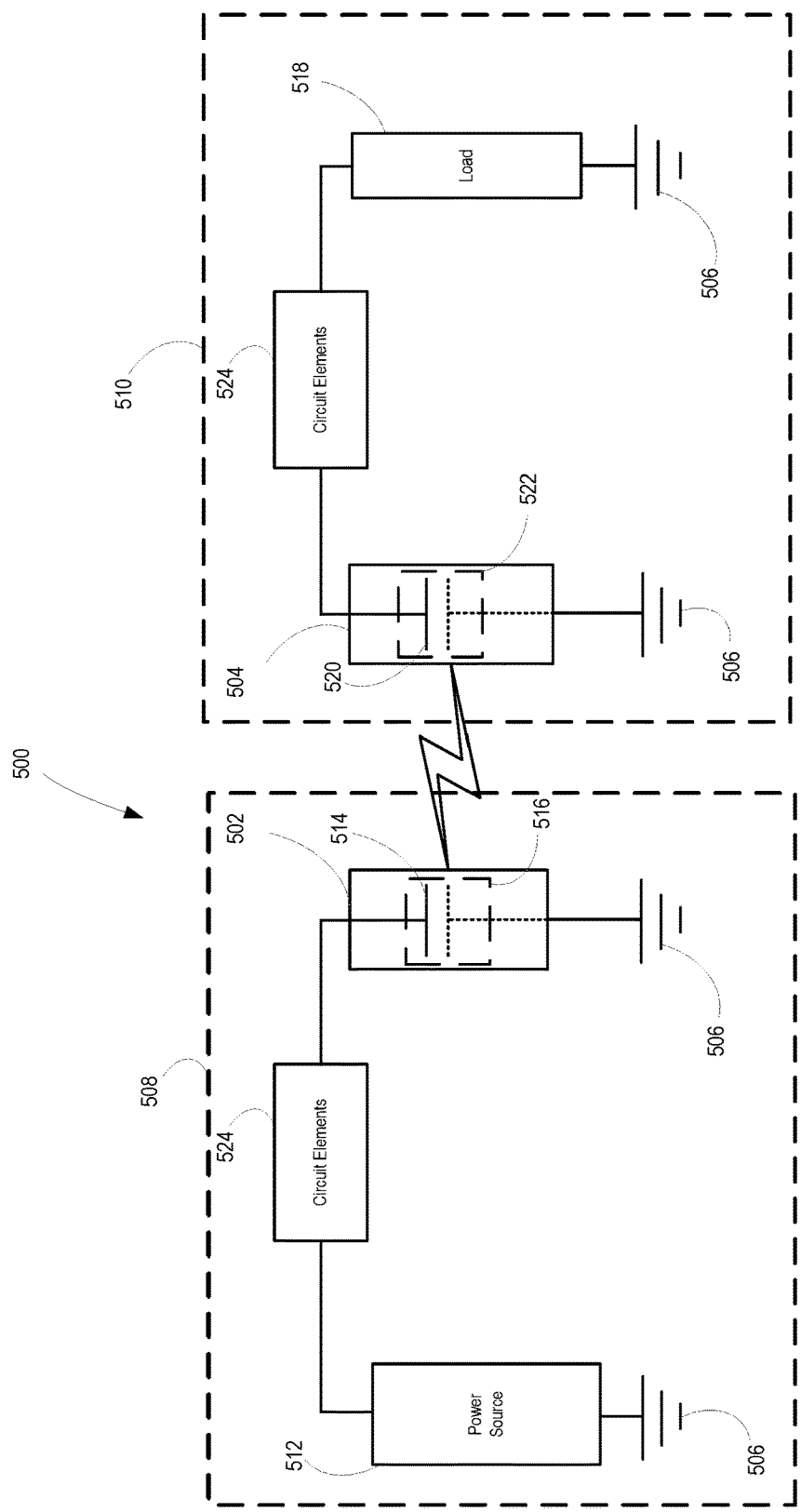
FIG. 5A to 5C illustrate a simplified circuit diagram of common mode capacitive resonant coupling, according to an example embodiment.
Figure 5B:
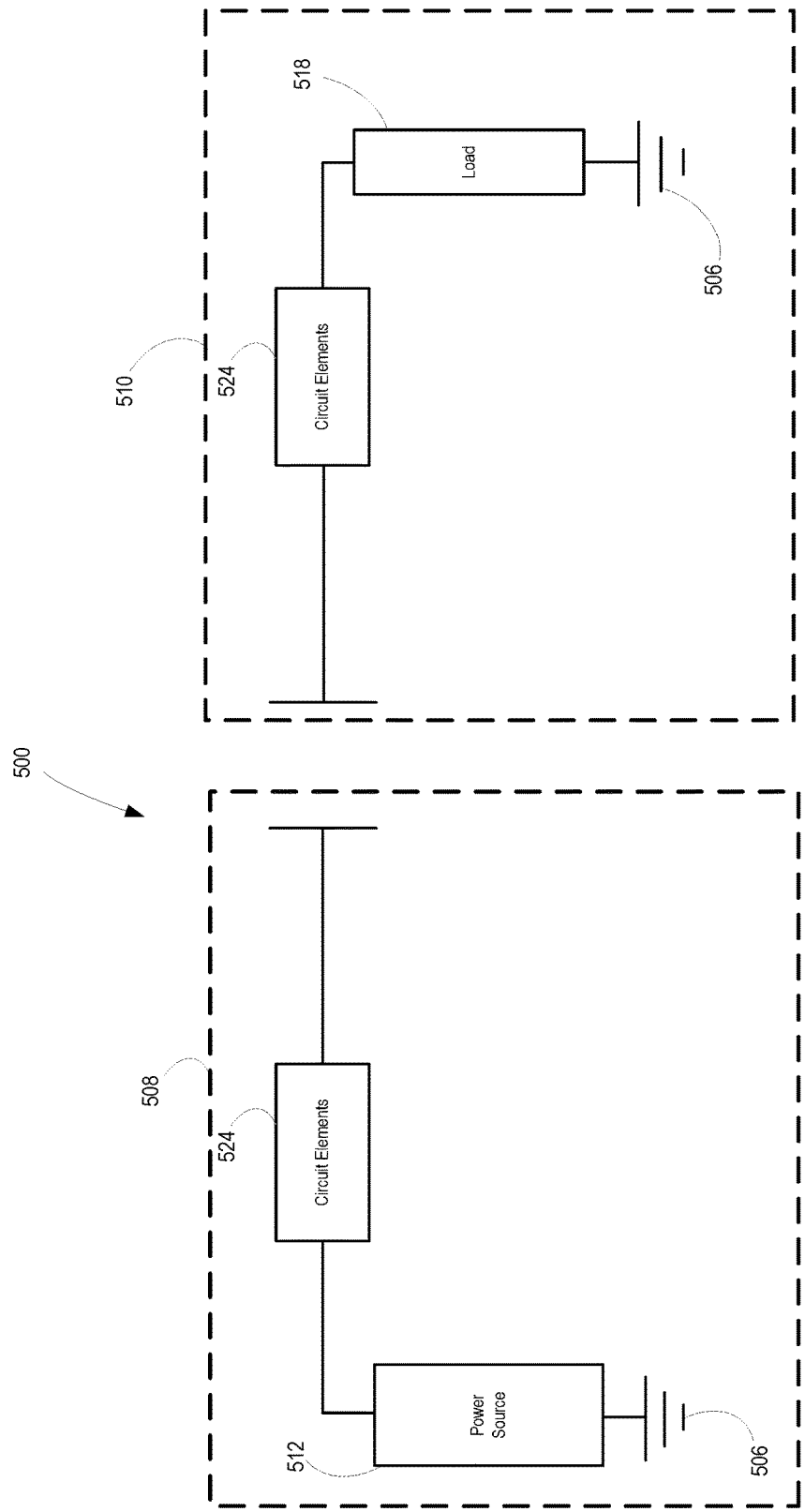
Figure 5C:
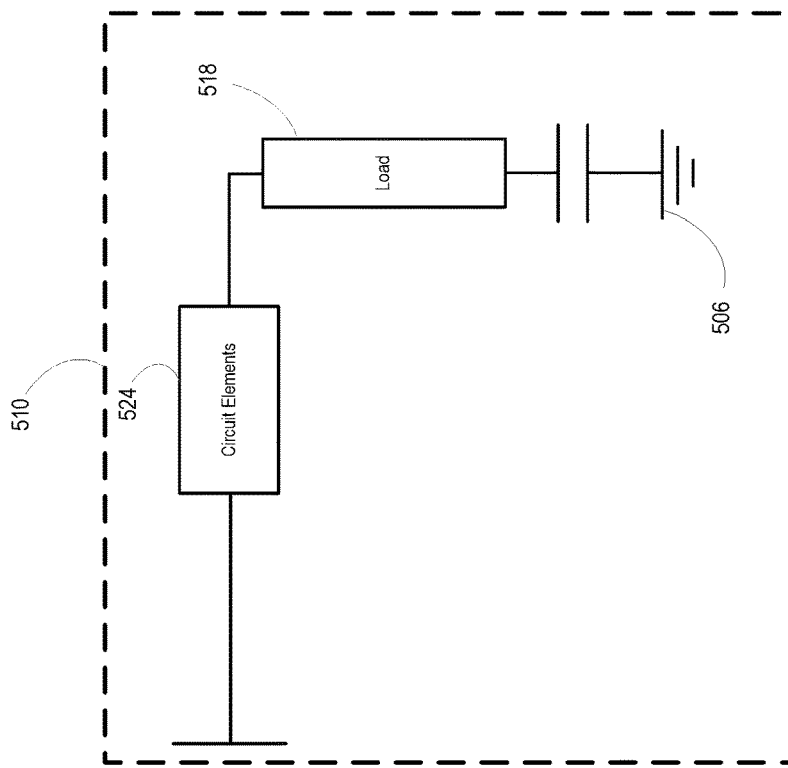
Figure 5C:
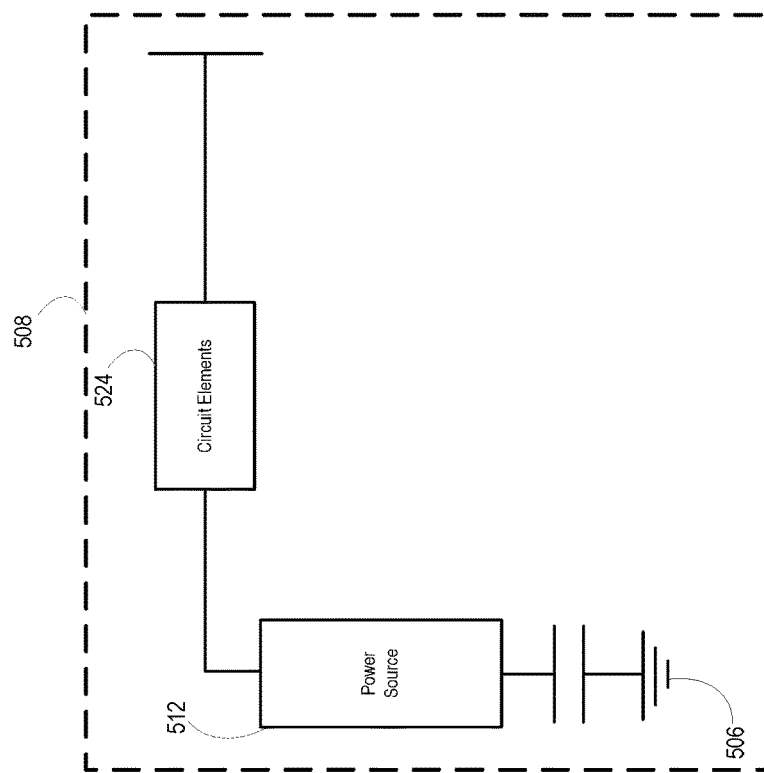

FIG. 5A, FIG. 5B, and FIG. 5C illustrate a system, in three representations, that includes a common mode capacitive resonator, according to an exemplary embodiment. Each of transmit-resonator 502 and receive-resonator 504 includes a common mode capacitive resonator. As such, each resonator includes a common mode capacitor that includes a conductor and ground reference 506. Ground reference 506 may conduct current to complete the circuit of transmitter 508 and receiver 510. Further, transmitter 508 may be coupled with power source 512 that may be connected on one end to ground reference 506 and on the other end to at least transmitter conductor 514. Optionally power source 512 need not be connected to the ground reference 506. Transmit-resonator 502 may resonate upon receiving, from power source 512, a signal that is oscillating at the system resonant frequency. As the transmit-resonator 502 resonates, common mode capacitor 516 of the transmit-resonator 502 may generate an electric field oscillating at the system resonant frequency. Receiver 510 may include load 518 that may be connected on one end to ground reference 506 and on the other end to receiver conductor 520. If within the near field of transmit-resonator 502, the receive-resonator 504 (which includes common mode capacitor 522) may couple with the oscillating electric field, thereby establishing a wireless resonant coupling link. As such, receive-resonator 504 may resonate, and may generate a signal that may be delivered to the load.

In some embodiments, the ground reference of the common mode capacitors may be connected to earth ground via a direct or an indirect connection. For example, the ground reference may include the infrastructure of a building housing the wireless power system, which may include an indirect connection to earth ground. In other examples, the ground reference may include a conductive object connected to common mode capacitors. As such, the conductive object may provide a conductive return path in a circuit including a transmitter and/or a receiver.

Figure 6A:
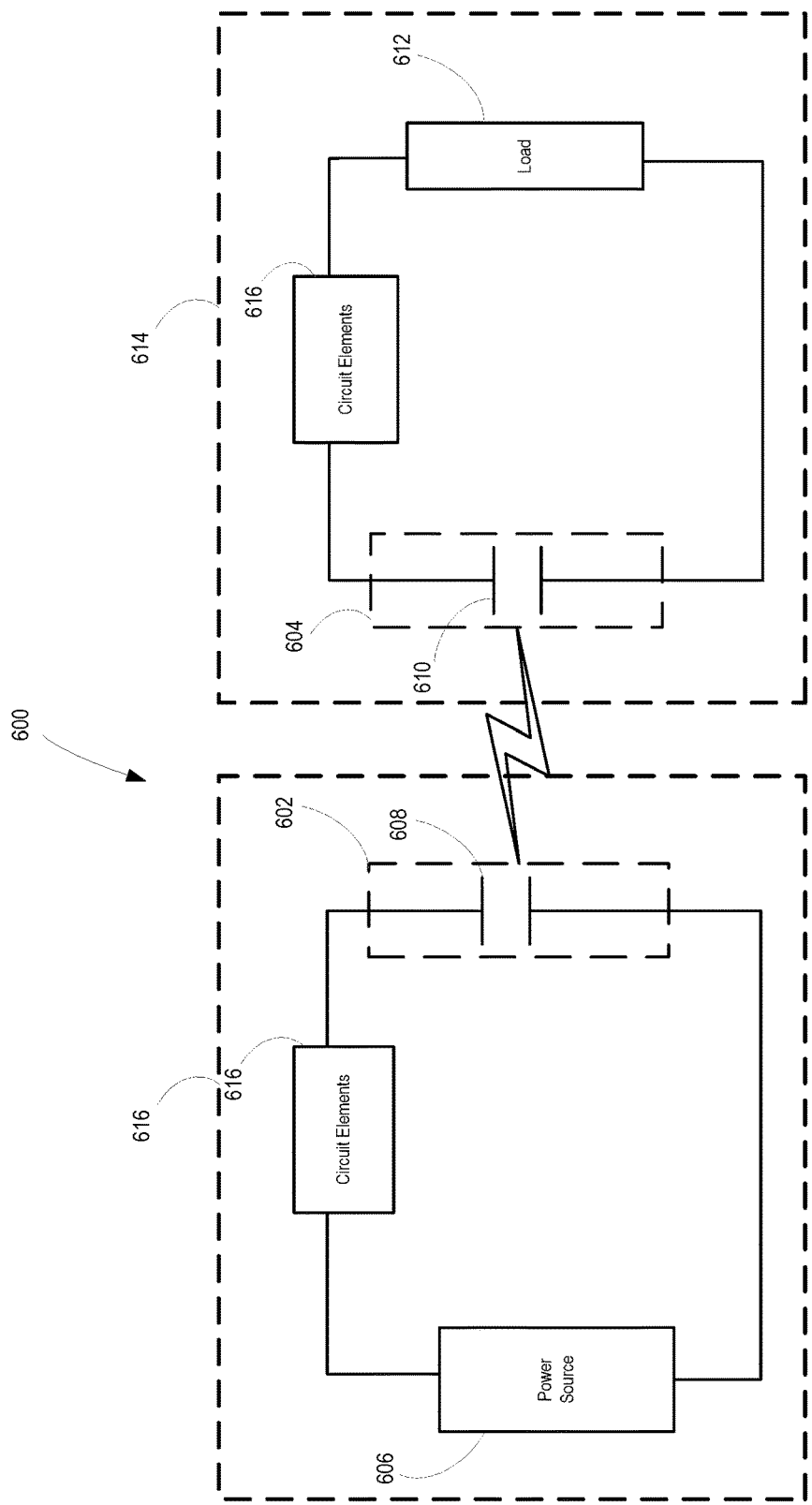
FIG. 6A to 6B is a simplified circuit diagram illustrating differential mode capacitive resonant coupling, according to an example embodiment.
Figure 6B:
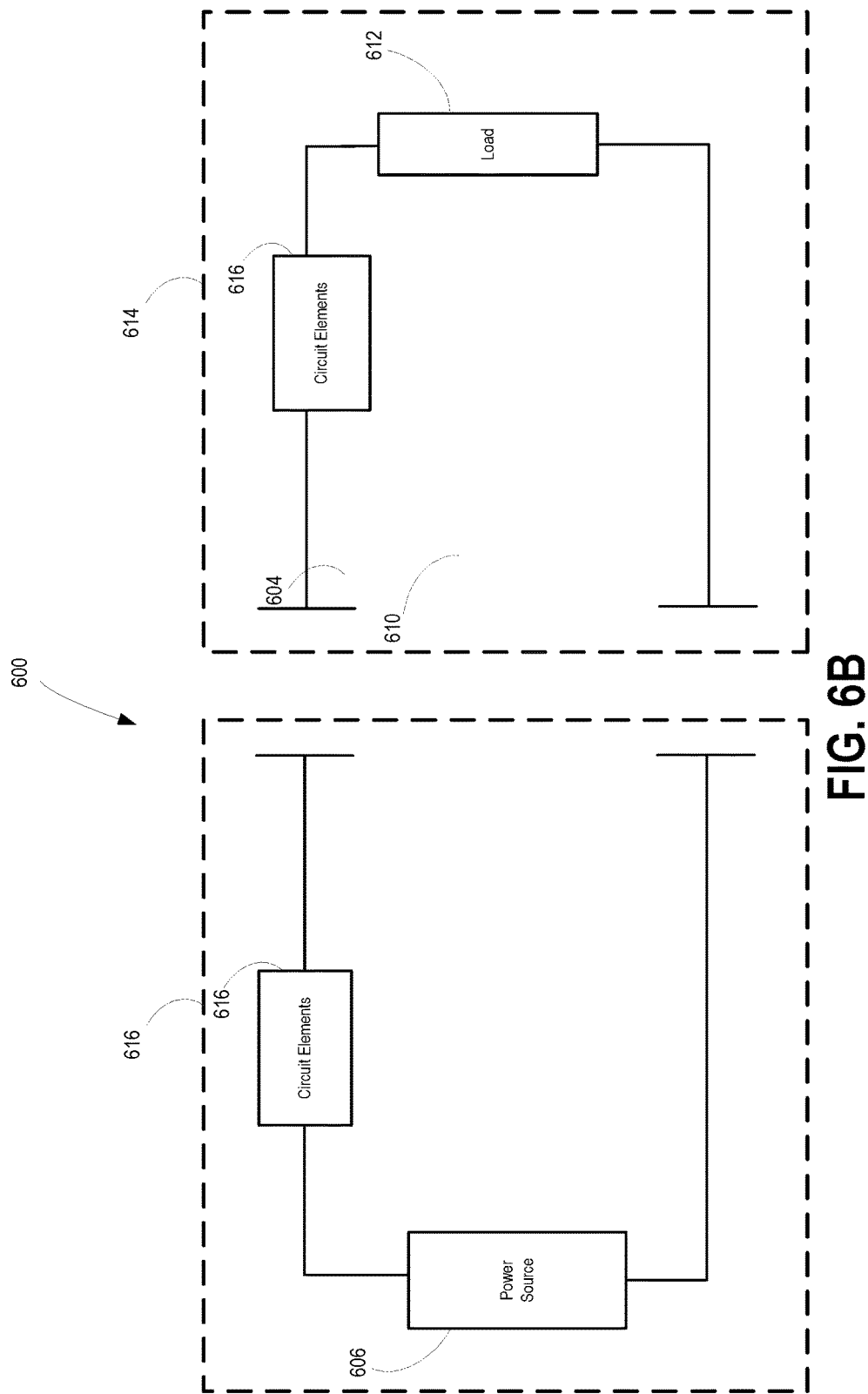

FIGS. 6A and 6B illustrate a system 600, in two representations, which includes a differential mode capacitor, according to an exemplary embodiment. Each of transmit-resonator 602 and receive-resonator 604 may include at least one capacitor. Power source 606 may supply a signal oscillating at a system resonance frequency to transmit-resonator 602. Transmit-resonator 602 may resonate upon receiving the signal from source 606. As transmit-resonator 602 resonates, transmitter differential mode capacitor 608 may generate an electric field oscillating at the system resonant frequency. Receive-resonator 604, if in proximity to the transmit-resonator 602, may couple with the oscillating electric field. As such, a wireless resonant coupling link may be established between the transmitter and the receiver. Furthermore, receiver differential mode capacitor 610 may resonate, and may therefore generate a signal that may be delivered to load 612 coupled to receiver 614.

In example embodiments, a system may establish a wireless resonant coupling link between a transmitter and a receiver according to one or more coupling modes that include a capacitive resonant coupling mode and an inductive resonant coupling mode. A transmitter and a receiver may each include the resonators necessary to establish a wireless link in each of the coupling modes. Furthermore, a wireless coupling link may be maintained between the transmitter and the receiver that utilizes different coupling modes simultaneously or individually. In some examples, the resonators may include a single circuit element that may be configured to operate either as an inductor, a capacitor, or both. In an example, an element may include coils shaped like a pair of conductor plates, such that the element may operate as an inductor and/or a capacitor. In other examples, a transmitter or receiver may include multiple resonators arranged in a resonator bank. The resonator bank may include at least one resonator that may include an inductor, and at least one resonator that may include a capacitor. Accordingly, the resonator bank may be configured to establish wireless resonant coupling links in capacitive and inductive resonant coupling modes.

Figure 7:
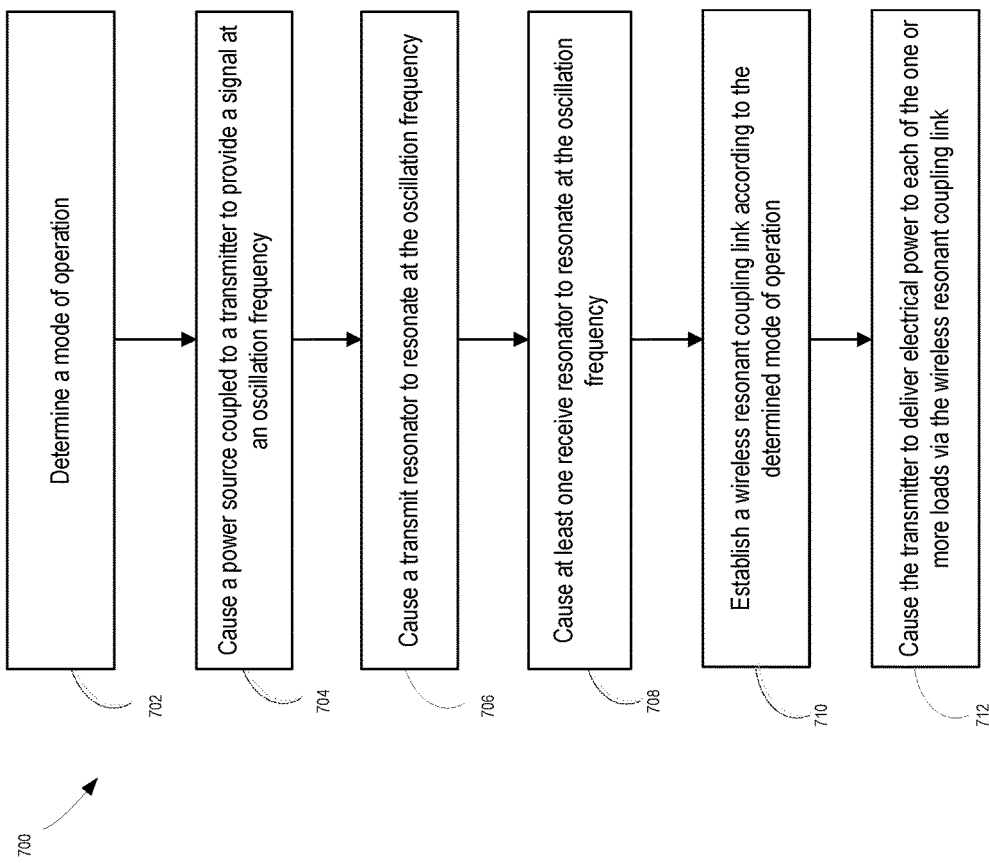
FIG. 7 illustrates a method of delivering electrical power from a transmitter to one or more loads, according to an example embodiment.

FIG. 7 illustrates a flowchart showing a method 700 that may establish a wireless resonant coupling link between a transmitter and a receiver of a system, according to an exemplary embodiment. In some embodiments, method 700 may be carried out by a controller of a system.

Furthermore, as noted above, the functionality described in connection with the flowcharts described herein can be implemented as special-function and/or configured general-function hardware modules, portions of program code executed by one or more processors for achieving specific logical functions, determinations, and/or steps described in connection with the flowchart shown in FIG. 7. For example the one or more processors may be part of controller 114. Where used, program code can be stored on any type of non-transitory computer-readable medium, for example, such as a storage device including a disk or hard drive.

In addition, each block of the flowchart shown in FIG. 7 may represent circuitry that is wired to perform the specific logical functions in the process. Unless specifically indicated, functions in the flowchart shown in FIG. 7 may be executed out of order from that shown or discussed, including substantially concurrent execution of separately described functions, or even in reverse order in some examples, depending on the functionality involved, so long as the overall functionality of the described method is maintained.

As shown by block 702, of FIG. 7, method 700 may involve determining an operational state of a system. The determined operational state may include at least one coupling mode. For example, the determined operational state may include any of the wireless coupling modes described herein. Within examples, the determined operational state may be determined by a controller of the system. As shown by block 704, method 700 further includes causing a power source that is coupled to a transmitter of a system to provide a signal at an oscillation frequency. For example, the oscillation frequency may be one of the one or more resonant frequencies of the transmitter. In some embodiments, the oscillation frequency may be a frequency within a range of resonant frequencies of the transmit-resonator.

Accordingly, as shown by block 706, a transmit-resonator may resonate at the oscillation frequency upon receiving the signal from the power source of the system. The oscillating transmit-resonator may generate a field oscillating at the oscillation frequency. In some embodiments, the transmit-resonator may generate a field that may be oscillating at a frequency within a range of resonant frequencies of the receive-resonator. As shown by block 708, if a receive-resonator is located within the range of the oscillating field generated by the transmit-resonator, the receive-resonator may also resonate at the oscillation frequency. As a result, as shown by block 710, a wireless resonant coupling link may be established according to the determined operational state. Finally, method 700 may cause the transmitter to deliver electrical power to each of the one or more loads via the established wireless resonant coupling link, as shown by block 712.

FIG. 8 illustrates different combinations of coupling modes that may form wireless resonant coupling link, according to an exemplary embodiment. In an example embodiment, a system may include a transmitter and a receiver both having three different types of resonator elements (e.g. an inductor, a common-mode capacitor, and a differential-mode capacitor). Accordingly, a wireless resonant coupling link between the transmitter and the receiver may include various combinations of the three different coupling modes. Accordingly, combinations 1-7 each include supporting a wireless resonant coupling link via at least one coupling mode. Operational state 8 represents when the system is not operating or when the transmitter and receiver are not coupled via a wireless resonant coupling link. Within examples, the various combinations of coupling modes forming the wireless coupling link between the transmitter and the receiver may be determined and controlled by a controller. In other examples, a user may provide an input to the controller that may direct the system to form a wireless resonant coupling link with a given combination of coupling modes.

In an example embodiment, a system may establish wireless resonant coupling links between a transmitter and a plurality of receivers. In such a scenario, the plurality of receivers may all operate in a single operational state to establish simultaneous links to the transmitter. In other scenarios, each of the receivers may establish a wireless resonant coupling link with the transmitter using a different coupling mode. Transmitters of such systems may include a resonator bank configured to enable simultaneous links with a plurality of receivers via one or more coupling modes.

As explained elsewhere herein, a system may employ time division multiple access (TDMA) to establish a wireless resonant coupling link that may be shared by a plurality of receivers. Specifically, the wireless resonant coupling link may be divided into different time slots within a given time frame. As such, each receiver of the plurality of receivers may receive electrical power from the transmitter during an assigned time slot within the given time frame. In other words, within the given time frame, the transmitter may distribute power to a given receiver during a given time slot. Each receiver may be assigned to receive power during one or more time slots within the time frame.

Figure 9A:
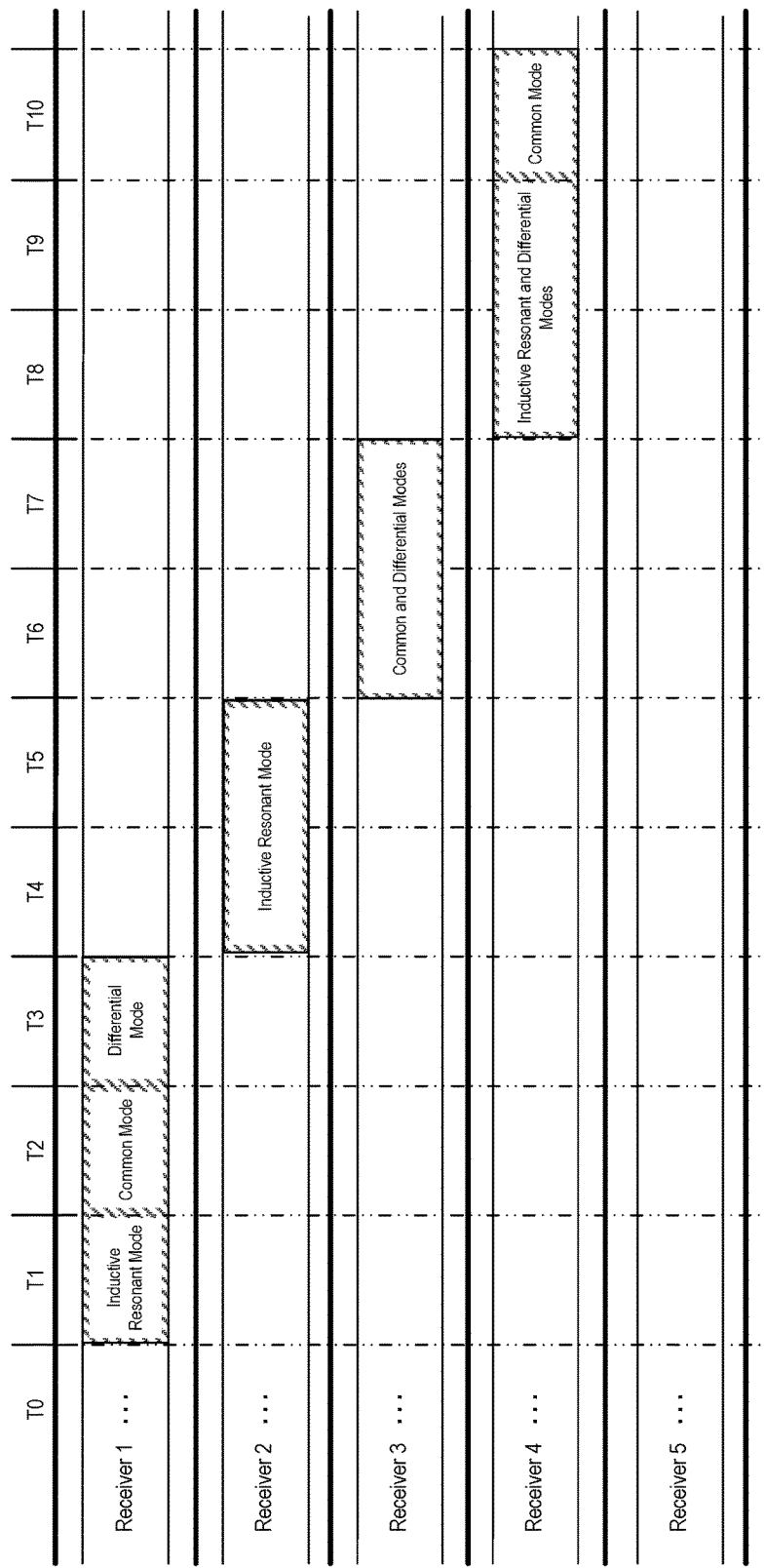
FIG. 9A to 9B illustrate a TDMA wireless resonant coupling channel, according to an example embodiment.

FIG. 9A illustrates a TDMA wireless resonant coupling link, according to an exemplary embodiment. Specifically, the ten time slots (T1-T10) may represent a single time frame of power distribution. The same distribution may be repeated in subsequent time slots T11-T20 and/or time frames (not shown). Furthermore, a controller of the system may assign each receiver of the system one or more time slots during which the receiver may receive power from the transmitter. In this example, receivers 1-4 are configured to receive power from the transmitter during various time slots of this time frame, whereas receiver 5 is not configured to receive power. In such a scenario, a controller may assign receivers 1-4 specific time slots during which they may receive power from the transmitter. The power may be transferred to a receiver during a given time slot according to any of the modes of operation of a system. Within examples, the controller may determine the operational state (e.g., the coupling mode type(s)) of each receiver during each interval of time. In other examples, the operational state may be input by a user of the respective receiver.

Figure 9B:
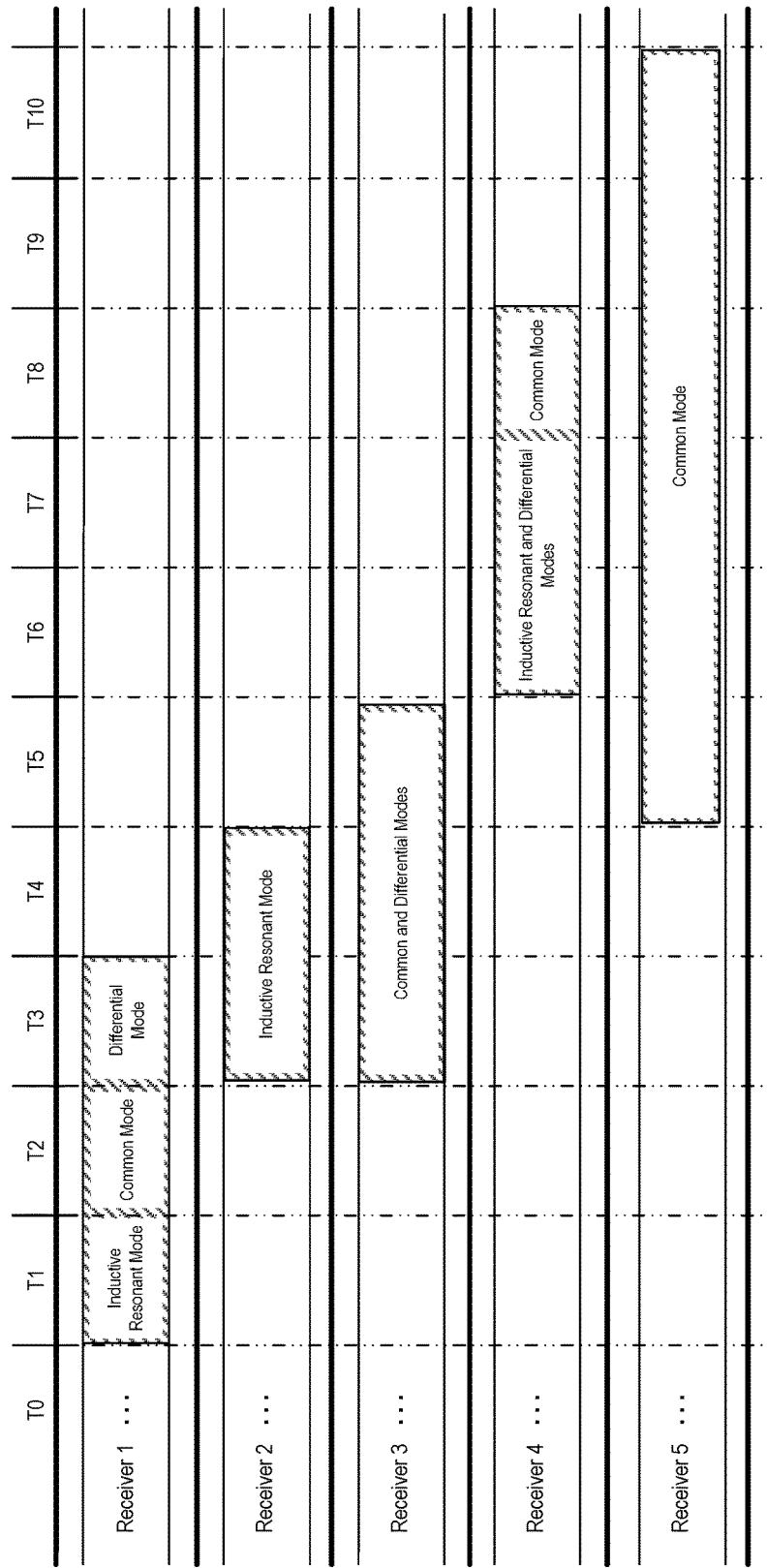

FIG. 9B illustrates a TDMA wireless resonant coupling link, according to an exemplary embodiment. Similar to the system illustrated in FIG. 9A, the ten time slots (T1-T10) may represent a single frame of power distribution. However, as illustrated in FIG. 9B, more than one receiver may receive power simultaneously from the transmitter. Furthermore, each receiver may receive power according to any of the modes of operation of the system. In some examples, the receivers receiving power simultaneously may receive power according to the same mode of operation. In other examples, the receivers receiving power simultaneously may receive power according to different modes of operation.

In accordance with some embodiments, the components (e.g., transmitter and receiver) of a system may include circuit elements (shown as element 212 in FIG. 2, element 414 in FIG. 4, element 524 in FIG. 5, and element 616 in FIG. 6), such as inductors, capacitors, transistors, inverters, amplifiers, rectifiers, varactors, relays, diodes, transmission lines, resonant cavities and switches, which may be arranged to facilitate switching between the different coupling modes of a system. For example, a system may switch between the different modes by having both a coil and one or two (or more) conductors in a combination of series-parallel connections. In other examples, a system may dynamically suppress or enhance a coupling mode by dynamically adding lumped element reactive components in series or parallel between the elements of the resonator of each mode.

In some examples, the operational state of a system may be determined by a controller of the system. For example, a controller may determine the mode of the operation of the system based on data that it may receive from a receiver, such as the receiver's power demands, preferred operational state, and location. Alternatively or additionally, the controller may determine the operational state based on data that may be input by a user of the system. Furthermore, the operational state may be determined based on the status of the system and/or environmental conditions.

In some embodiments, a controller may switch the operational state in response to detecting a parasitic device (using methods described herein) that may be diverting power from a legitimate receiver. In an example, a system may be operating in a state that utilizes common mode resonant coupling. However, a controller may detect a parasitic device that may also be coupled to the transmitter using common mode. In response, the controller may stop wireless power delivery via the common mode, and may enable wireless power delivery via a differential capacitive coupling mode, an inductive resonant coupling mode, or both. In other embodiments, a controller may use environmental conditions to determine the system's operational state. For example, a controller may receive information indicative of a presence of high ferrite content objects in the system's environment. Accordingly, the controller may determine to operate in a mode that does not utilize inductive resonant coupling mode.

A controller may also determine an amount of electrical power that a system may deliver to each load in the system. The controller may also make a determination of how much electrical power to deliver to each load via each available coupling mode in the system. Accordingly, in an example, the controller may cause the power source to direct the determined amount of power to a resonator bank and further control the delivery of power to the respective receivers via the respective determined coupling modes.

Furthermore, external elements may be installed in a system's environment, which may be configured to improve or otherwise modify the performance of the system. In some embodiments, field concentrators may be configured to shape an oscillating magnetic field (of an inductive resonator), an oscillating electric field (of a capacitive resonator), or both. For example, high permeability materials, such as ferrites, may be installed in a system's environment. In an example embodiment, while the system is operating in inductive resonant coupling mode, the high permeability material may be arranged so as to shape the oscillating magnetic field and extend its range. Similarly, high permittivity dielectric materials may be arranged in a system's environment. A capacitor of the system may utilize the high permittivity dielectric materials to increase or otherwise modify its capacitance, and hence adjust the properties of the electric field produced by a resonant capacitor. Furthermore, conductors may also be arranged in a system's environment so as to affect the magnetic and/or the electric field produced by the system's resonators.

Within examples, a system may include circuit elements that may be used as necessary in the system to implement the system's functionality. For example, a system may include circuit elements such as inverters, varactors, amplifiers, transmission lines, resonant cavities rectifiers, transistors, switches, relays, capacitors, inductors, diodes, and conductors. A relay may be used for switching between circuit elements configured to operate each coupling mode. As explained herein, a switch may connect a load to a receiver, such that the load is switchably coupled to the receive-resonator. Other examples of possible uses for various circuit elements are possible.

B. Power Transfer to Legitimate Receiver(s)

Figure 10:
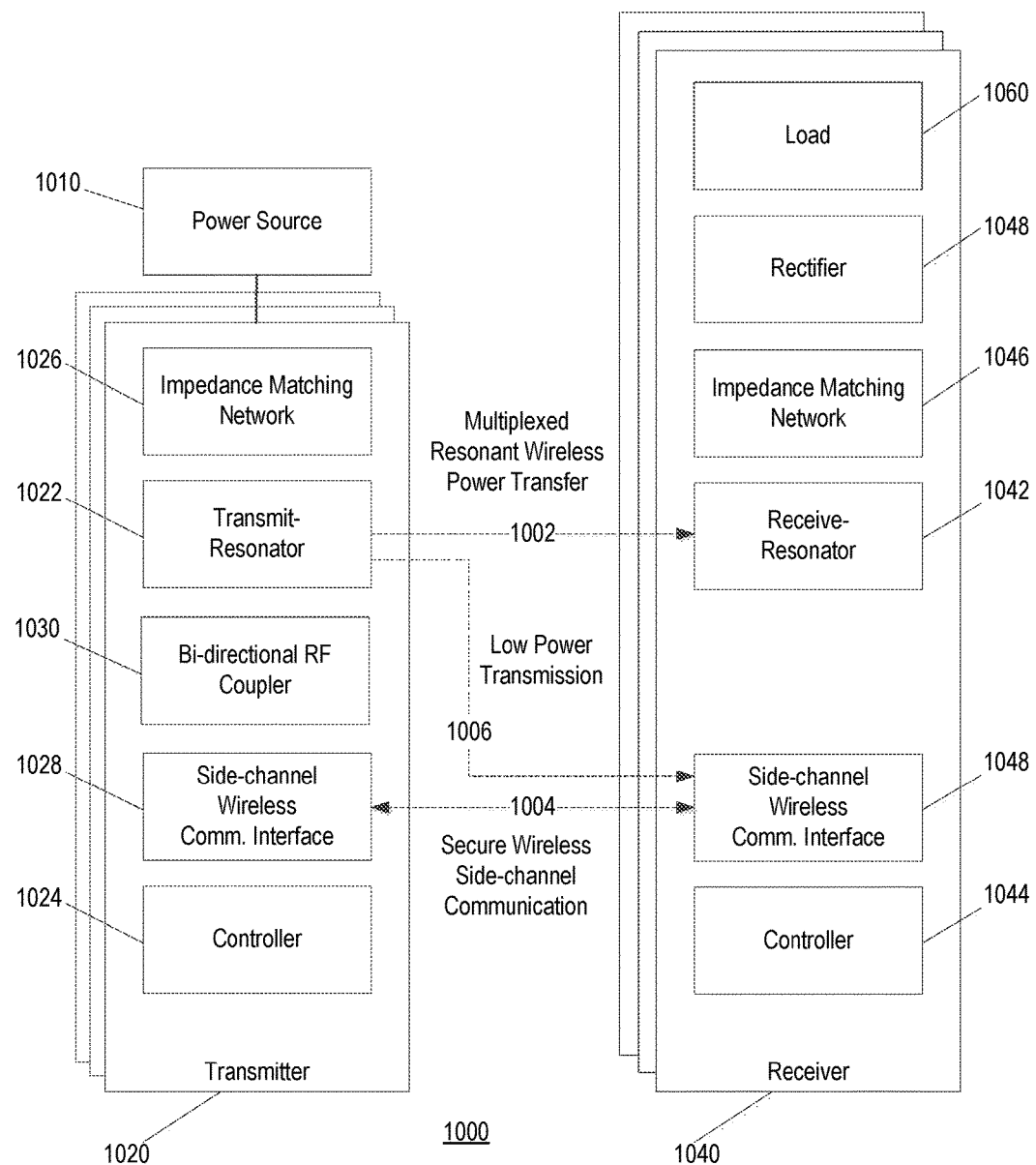
FIG. 10 is a functional block diagram illustrating a wireless power delivery system employing side-channel communications, according to an example embodiment.

FIG. 10 illustrates a resonant wireless power delivery system 1000 according to an example embodiment. The system 1000 includes a power source 1010, a transmitter 1020, and a receiver 1040. The transmitter 1020 receives power from the power source 1010 and wirelessly transfers this power to the receiver 1040. The transmitter 1020 may be one of a plurality of transmitters. The receiver 1040 is one of a plurality of receivers that may receive power from the transmitter 1020.

The transmitter 1020 includes a transmit-resonator 1022, and the receiver 1040 includes a receive-resonator 1042. The transmit-resonator 1022 is supplied with a power signal from the power source 1010 oscillating at a resonant frequency $\omega_0$. As described above, the transmit-resonator 1022 resonates at the resonant frequency $\omega_0$ and generates a field that oscillates at the resonant frequency $\omega_0$. The receiver-resonator 1042 is correspondingly configured to resonate at the resonant frequency $\omega_0$. The receiver 1040 is placed in sufficient proximity to the transmitter 1020 to couple the receive-resonator 1042 with the field generated by the transmit-resonator 1022, e.g., the receiver-resonator 1042 is within the field of the transmit-resonator 1022 depending for instance on the quality factor Q as described above. This coupling establishes a resonant power transfer link 1002 that provides a wireless conduit for power transfer between the transmit-resonator 1022 and the receive-resonator 1042. As also described above, the transmit-resonator 1022 and the receive-resonator 1042 may be coupled via an oscillating magnetic field and/or an oscillating electric field. In particular, the coupling may include any one or more of the following three modes: (i) inductive mode, (ii) differential capacitive mode, and (iii) common capacitive mode.

While the receive-resonator 1042 resonates in response to the oscillating field, a rectifier 1048 or other power conversion circuit may convert power from the receive-resonator 1042 and subsequently deliver the power to a load 1060. While the load 1060 is incorporated into the receiver 1040 as illustrated in FIG. 10, some embodiments may include loads that are physically separate or otherwise apart from the receiver 1040.

As shown in FIG. 10, the transmitter 1020 includes a controller 1024. In an example embodiment, the controller 1024 may determine what coupling mode(s) to employ and may control various elements of the transmitter 1020 so as to establish and/or maintain wireless resonant coupling links according to the determined coupling mode(s). The controller 1024 may also determine the amount of power that is transferred via the respective coupling mode(s).

As also described above, higher efficiencies can be achieved by adjusting impedances (resistance and/or reactance) on the transmitting side and/or the receiving side, e.g., impedance matching. Accordingly, the transmitter 1020 may include an impedance matching network 1026 coupled to the transmit-resonator 1022. Similarly, the receiver 1040 may include an impedance matching network 1046 coupled to the receive-resonator 1042.

In an example embodiment, a plurality of devices and objects may be present within a local environment of the transmitter 1020. In such a scenario, the example system 1000 may be configured to distinguish legitimate receivers from illegitimate devices that are not intended recipients of power transfer. Without an ability to discriminate between possible recipients of power transfer, illegitimate devices may act as parasitic loads that may receive power from the transmitter without permission. Thus, prior to transferring power to the receiver 1040, the transmitter 1020 may carry out an authentication process to authenticate the receiver 1040. In an example embodiment, the authentication process may be facilitated via a wireless side-channel communication link 1004.

The transmitter 1020 may include a wireless communication interface 1028 and the receiver 1040 may include a corresponding wireless communication interface 1048. In such a scenario, the transmitter 1020 and the receiver 1040 may establish a side-channel communication link 1004 via a wireless communication technology. For instance, classic BLUETOOTH® or BLUETOOTH® LOW ENERGY (BLE) (2.4 to 2.485 GHz UHF) or WIFI™ (2.4 GHz UHF/5 GHz SHF) may be employed to provide secure communications between the transmitter 1020 and the receiver 1040. Other wireless communication protocols are possible and contemplated. As shown in FIG. 10, the side-channel link 1004 communicatively couples the transmitter 1020 and the receiver 1040 over a secondary channel that is separate from the resonant power transfer link 1002. In alternative embodiments, however, the transmitter 1020 and the receiver 1040 may employ the same channel to transfer power and communicate information as described herein, e.g., by modulating aspects of the power transfer to communicate the information.

In an example embodiment the transmitter 1020 can communicate with the receiver 1030 over the side-channel communication link 1004 to determine that the receiver 1040 is authorized or otherwise permitted to receive power. The receiver 1040 may be configured to provide any type of information and/or acknowledgement required by the transmitter 1020 to authenticate the receiver 1040. For instance, the receiver 1040 may transmit an authentication code, a message, or a key to the transmitter 1020. In such scenarios, a device without the ability to establish side-channel communications with the transmitter 1020 may not be identified as a legitimate device.

The receiver 1040 may also include a controller 1044. As such, the controllers 1024, 1044 can conduct communications via the side-channel link 1004 and process the information exchanged between the transmitter 1020 and the receiver 1040.

As described above, when power is transferred from the transmitter 1020 to the receiver 1040, power may be reflected back to the transmitter 1020 As FIG. 10 illustrates, the transmitter 1020 may include a bi-directional RF coupler 1030 to measure the reflected power as also described above. Using measurements from the bi-directional RF coupler 1030, an optimal efficiency for the power transfer link 1002 may be ascertained, and the impedance(s) on the transmitting and/or receiving sides can be adjusted via the impedance matching networks 1026, 1046 so as to optimize or otherwise modify power delivery efficiency.

The impedance associated with the receiver 1040 may be determined based on the reflected power detected by measurement devices in conjunction with the bi-directional RF coupler 1030. If a nominal impedance (e.g., a designed impedance) of the receiver 1040 is known, a difference between the nominal impedance and the calculated impedance based on the measurement of reflected power may indicate a presence of one or more parasitic loads. Such parasitic loads may include illegitimate receivers. Using the side-channel communication link 1004 established between the transmitter 1020 and the receiver 1040, the receiver 1040 may be operable to communicate its nominal impedance to the transmitter 1020. Thus, the calculation of impedance using the bi-directional RF coupler 1030 may enable the identification of parasitic loads as well as enable dynamic impedance matching as disclosed elsewhere herein. The impedance(s) of the transmitter 1020 and/or the receiver 1040 can be adjusted via the impedance matching networks 1026, 1046 to account for the parasitic loads.

As described herein, the transmitter 1020 may be operable to identify the existence of the legitimate receiver 1040 through authentication communications via the side-channel communication link 1004. Additionally or alternatively, the transmitter 1020 may be operable to distinguish the legitimate receiver 1040 from other legitimate or illegitimate devices by other methods. In particular, the transmitter 1020 may be operable to control the power transfer link 1002 and the communication over the side-channel communication link 1004 with the same receiver 1040.

The side-channel communication link 1004 may be employed to identify and authenticate the receiver 1040 and to establish and adjust aspects of the power transfer link 1002, particularly to account for parasitic loads. Specifically, the side-channel communication link 1004 and the power transfer link 1002 may enable a variety of authentication protocols so as to provide secure communications and power delivery. For example, the transmitter 1020 and receiver 1040 may be operable to conduct a password authentication protocol (PAP), a challenge-handshake authentication protocol (CHAP), multi-factor authentication, or another type of cryptographic protocol. In general, however, the transmitter 1020 and the receiver 1040 may employ the side-channel communication link 1004 to exchange any type of information to manage any aspect of the power transfer link 1002.

In an example embodiment, the system 1000 may help ensure the availability of the side-channel communication link 1004 by intermittently or continuously transmitting a certain amount of power via a predetermined wireless resonant coupling link configuration. This transmission 1006 can power the wireless communication interface 1048 and allow it to remain active even if other aspects of the receiver 1040 do not receive power. As such, the receiver 1040 may receive sufficient power to establish initial communications with the transmitter 1020. Thereafter, the receiver 1040 may establish the power transfer link 1002. For instance, the transmission 1006 may provide a low power, e.g., approximately 1 W. In such a scenario, the power distribution efficiency of the transmission 1006 is less of a concern at relatively low powers.

As described above, the controller 1024 may determine what coupling mode to employ in the example system 1000. The controller 1024 may select coupling mode(s) based on the identification of parasitic loads. For instance, the transmitter 1020 may deliver power to the receiver 1040 via a common capacitive mode during a first time period. However, subsequent to the first time period, the controller 1024 may detect a parasitic device that may also be coupled to the transmitter 1020 via common capacitive mode. Consequently, the controller 1024 may cause the transmitter 1020 and/or the receiver 1040 to a switch to differential capacitive mode and/or inductive mode.

C. Updating Operating Parameters of the System

Figure 11:
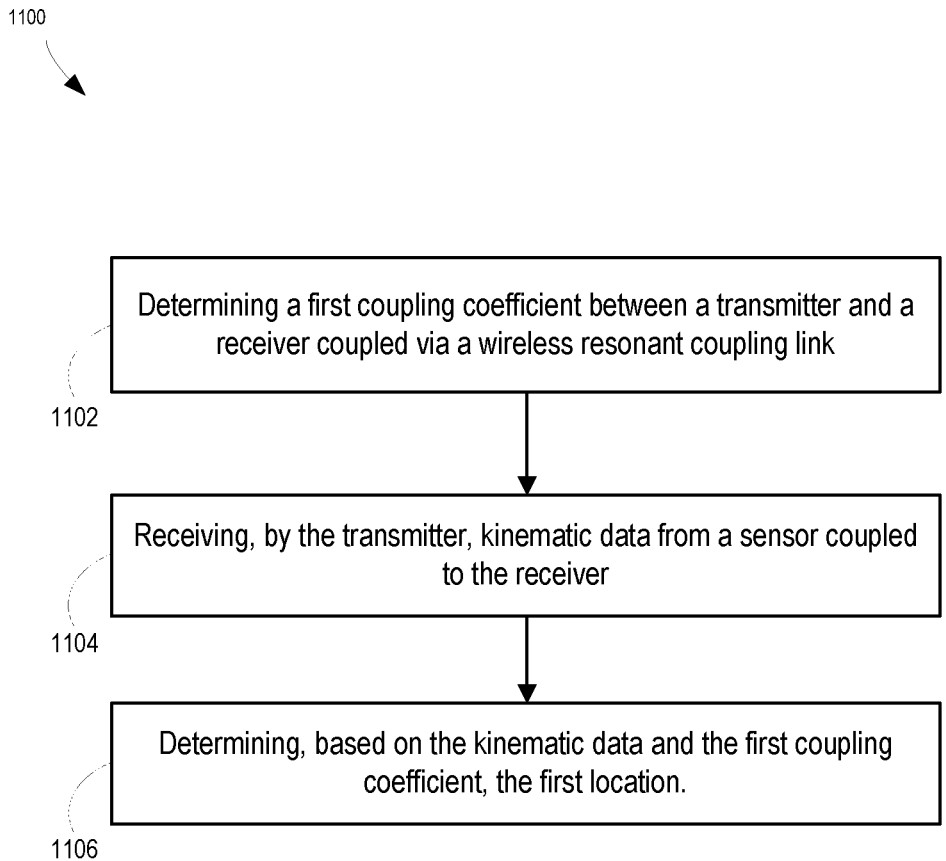
FIG. 11 illustrates a method of determining a pose of a receiver, according to an example embodiment.

FIG. 11 illustrates a flowchart showing a method 1100 that may accurately determine a pose of a receiver of the wireless power system, according to an exemplary embodiment. In some embodiments, the method 1100 may be carried out by the controller of the wireless power system.

As noted above, the functionality described in connection with the flowcharts described herein can be implemented as special-function and/or configured general-function hardware modules, portions of program code executed by one or more processors for achieving specific logical functions, determinations, and/or steps described in connection with the flowchart shown in FIG. 11. For example the one or more processors may be part of controller 114 of FIG. 1. Where used, the program code can be stored on any type of non-transitory computer-readable medium, for example, such as a storage device including a disk or hard drive.

In addition, each block of the flowchart shown in FIG. 11 may represent circuitry that is wired to perform the specific logical functions in the process. Unless specifically indicated, functions in the flowchart shown in FIG. 11 may be executed out of order from that shown or discussed, including substantially concurrent execution of separately described functions, or even in reverse order in some examples, depending on the functionality involved, so long as the overall functionality of the described method is maintained.

In an embodiment, the method 1100 may be performed by a wireless power system that includes a transmitter and a receiver disposed in an environment. A position and/or orientation of a device disposed in the environment may be described by a pose of the device. A pose of a device may be indicative of an absolute position and/or orientation of the device with respect to a reference coordinate system in the environment. For example, the pose of the receiver relative to the reference coordinate system may be described in 1-D, 2-D, and/or 3-D coordinates (e.g., Cartesian Coordinates). Additionally and/or alternatively, the pose of a device may be indicative of the position and/or orientation of the device relative to another device disposed in the environment.

Within examples, a position element of the pose of device may be described as an absolute position with respect to a coordinate system in the environment. The coordinate system may be a 2-D or 3-D coordinate system. Additionally and/or alternatively, the position of a device may be described relative to the position of other devices part of the system. For example, the position of the receiver may be described with respect to the position of the transmitter. Describing the position of the receiver relative to the position of the transmitter may be useful in systems where the position of the transmitter is fixed and the receiver is mobile. It may also be useful in systems where the transmitter and the receiver are both mobile.

Similarly, the orientation element of the pose of a device may be described with respect to a reference coordinate system and/or with reference to another device. The orientation may be described using angles such as Euler angles. In some examples, the pose of the receiver relative to the transmitter may be described in polar coordinates. Other examples of coordinates and angles that describe the pose of the transmitter and/or the receiver are also possible.

As shown by block 1102 of FIG. 11, the method 1100 includes determining a first coupling coefficient between a transmitter and a receiver coupled via a wireless resonant coupling link. As described above, the controller may determine the first coupling coefficient based on a reflected impedance from the receiver. In an example, this step may be performed by the wireless power system upon powering on the transmitter and/or the receiver. As also described above, the controller may use the determined coupling coefficient to set the values of the operating parameters of the system (e.g., setting the impedance of the impedance matching networks in the system). The operating parameters may be determined such that the transmitter, when operating at the parameters, transfers a specified amount of electrical energy to the receiver.

At block 1104, the method 1100 further includes receiving, by the transmitter, kinematic data generated by a sensor coupled to the receiver. In an embodiment, the sensor may be an inertial measurement unit (IMU) coupled to the receiver, and the kinematic data may thus be IMU data. The sensor coupled to the receiver may generate data that is then transmitted to the controller of the wireless power system. Although this embodiment describes sensors coupled to the receiver, similar sensors (e.g., an IMU) may be coupled to the transmitter as well.

An IMU may include both an accelerometer and a gyroscope, which may be used together to determine the orientation of the device to which it is coupled, among other system parameters. In particular, the accelerometer measures the orientation of the device with respect to a reference frame, while the gyroscope measures the rate of rotation around an axis. Based on the measurements, the IMU may generate data indicative of the angular velocity and linear acceleration of the device. IMUs are also commercially available in low-cost, low-power packages. For instance, the IMU may take the form of or include a miniaturized Micro-ElectroMechanical System (MEMS) or a NanoElectroMechanical System (NEMS). Other types of IMUs also may be utilized. The IMU may include other sensors, in addition to accelerometers and gyroscopes, which may help to better determine position. Two examples of such sensors are magnetometers and pressure sensors. Other examples are also possible.

At block 1106, the method 1100 further includes determining, based on the kinematic data and the first coupling coefficient, a first location of the receiver. In particular, the controller may use the kinematic data and the first coupling coefficient to accurately determine the pose of the receiver. In some examples, the controller may determine either the position element or orientation element of the pose of the receiver. In other examples, the controller may determine both the position and orientation of the receiver.

In an embodiment, the controller may determine the orientation element of the receiver's pose based on the received kinematic data, which in this embodiment, may be IMU data. As explained above, the IMU data may be indicative of the orientation of the receiver with respect to a frame of reference. In some examples, the controller may determine the orientation of the receiver in the environment with respect to the coordinate system in the environment. In other examples, the controller may determine the orientation of the receiver with respect to the transmitter in the environment. The pose of the transmitter may be known to the controller in examples where the controller controls the pose of the transmitter.

The controller may determine the position element of the receiver's pose based on the coupling coefficient of the wireless resonant coupling link. In particular, the coupling coefficient may be a function of a geometric relationship between the transmitter and the receiver. The controller may generate a correlating function that is indicative of the correlation between the geometric relationship and the coupling coefficient. In an embodiment, the controller may use the correlation function to determine the geometric relationship between the transmitter and the receiver using the value of the coupling coefficient determined in step 1102. The controller may then use the determined geometric relationship and the location of the transmitter (which is known to the controller) to determine the location of the receiver in the environment.

In an embodiment, the correlation function may be a function of the geometric relationship between the transmitter and the receiver and/or a function of the characteristics of the transmitter and the receiver (e.g., geometry of the transmit-resonator and the receive-resonator). The correlation function may also be a function of the system parameters such as losses and reactances in the system, which, as described above, may be determined using an equivalent circuit model of the system. The correlation function may also be a function of the coupling mode in which the system is operating. The correlation function may be characterized in an ideal environment, and the characterized function may be stored in the receiver's memory. The controller may then adjust the correlation function based on the environment in which the receiver is located. Additionally and/or alternatively, the controller may adjust the correlation function based on the determined system parameters. In some examples, the correlation function may be derived from a model of the system (e.g., a computer generated model). In yet another example, the controller may retrieve the correlation function from a server (e.g., an internet server), based on the environment in which the receiver is located and/or the characteristics of the transmitter and/or the receiver, for instance.

In an embodiment, the correlation function may be represented as look-up table (LUT) stored in a memory of the transmitter or receiver. In an example, the LUT may be a seven entry LUT that is indicative of the coupling coefficient in terms of the position of the receiver in six degrees of freedom (DOF). As such, the seven entries of the LUT may be (i) the coupling mode (1 entry), (ii) the angle of the receiver (3 entries), and (iii) the position of the receiver (3 entries). The controller may use the LUT to solve for the coupling coefficient between the transmitter and the receiver by determining one or more of the seven entries of the LUT. Alternatively, the controller may solve for one or more of the entries based on a determined coupling coefficient and one or more determined entries. For instance, the controller may solve for the position of the receiver based on the coupling coefficient and/or the pose.

In other examples, the LUT may include more than or less than seven entries. For instance, a simplified LUT may include two entries for the angle of the receiver and/or two entries for the position of the receiver. In another instance, a simplified LUT may represent a relationship between position of the receiver and the coupling coefficient. In yet other examples, the LUT may be parameterized using piecewise functions or simpler parameterized functions. The parameterization function may depend on a functional form of the correlation function.

However, receivers are typically mobile and the environment in which they are located may frequently change. A change in a receiver's pose and/or a change in its environment may result in a change in the configuration of the system. For instance, a change in the pose of a receiver relative to the transmitter may result in a change in the power that is received by the receiver. In an embodiment, the controller may detect a change in the system by monitoring one or more system parameters.

In an example, the controller may detect a change in the system by monitoring power received by the receiver, via a power sensor coupled to the receiver, for instance. The power sensor may generate data indicative of the measured power at the receiver, and may transmit the generated data to the controller (e.g., via the side-channel). Additionally and/or alternatively, the power sensor may transmit the data to the controller by modulating the power signal that is reflected from the receiver to the transmitter. Other methods of transmitting data from the receiver to the transmitter are also possible.

The controller may use the power data to monitor the power received by the receiver to detect a change in the received power. A change in the received power may be indicative of one of several possible changes in the system. An interference that affects the wireless resonant coupling link is a change that could cause the received power to change. In an example, the interference may be due to an unintended recipient coupling to the transmitter and siphoning power, intended for the receiver, from the transmitter. After detecting the change in received power, the controller may use the side-channel authentication process described herein to determine whether an unintended recipient is authorized to use the system. If the recipient is an authorized receiver, the system may allocate appropriate resources to the unintended recipient. Otherwise, if the receiver is an unauthorized receiver, the controller may cease transfer of power to the unintended recipient. The controller may cease transfer of power to the unintended recipient by tuning the oscillation frequency of the wireless power system to a different frequency and sending signals to the authorized receivers informing them of the change. Other methods of ceasing the transfer of power to a receiver are described elsewhere herein.

Additionally, a movement by the receiver may cause a change in the power received by the receiver. In particular, the receiver's movement may cause a change in at least the coupling between the transmitter and the receiver, which may affect the amount of power that is received by the receiver. The controller may determine whether the change in power is due to interference or a receiver's movement based on additional data that may be indicative of the cause of the change in power.

In an embodiment, after detecting the change in power received at the receiver, the controller may determine that the receiver has moved based on the kinematic data that is received from the receiver. If the kinematic data (e.g., acceleration data) does not indicate that the receiver has moved, the controller may determine that the cause of the change in power is interference. Conversely, if the kinematic data is indicative of a movement, the controller may determine that the cause of the change in power is the receiver's movement.

In response to detecting the movement of the receiver, the controller may determine an adjustment to the operating parameters of the wireless power system. The adjustment to the operating parameters may maintain the transfer of power to the receiver at a specified level. By maintaining the amount of transferred power at a substantially constant amount, the receiver may avoid experiencing significant drops in electrical power that may cause the receiver to malfunction. In an example, the controller may adjust the amount of power transferred by the transmitter in order to maintain the amount of the power that is received by the receiver at the specified level.

In another example, the controller may determine an adjustment to the impedance of the impedance matching networks to maintain the transfer of power to the receiver at the specified level. But, as described above, determining the adjustment to the impedance matching network may consume considerable resources since determining the coupling coefficient (to calculate the adjustment) consumes considerable resources. Therefore, the system may squander valuable resources as the controller recalculates the coupling coefficient each time the receiver changes its pose.

In an embodiment, rather than determining the coupling coefficient based on reflected impedance, the controller may estimate the coupling coefficient based on a determined pose of the receiver. Estimating the coupling coefficient based on the pose of the receiver may consume fewer resources than determining the coupling coefficient based on the reflected impedance. The controller may estimate the coupling coefficient from the pose of the receiver, since the coupling coefficient, as explained above, is a function of the geometric relationship between the transmitter and the receiver. Accordingly, the controller, after determining the geometric relationship between the transmitter and the receiver, may use the correlation function to estimate the coupling coefficient. For example, where the correlation function is represented by the LUT, the controller may estimate the coupling coefficient based on the determined pose of the receiver.

In an embodiment, the controller may determine the pose of the receiver, subsequent to a movement of the receiver, based on kinematic data received from the sensor coupled to the receiver. The controller may use the received kinematic data to determine a relative change in the pose of the receiver from the pose of the receiver prior to the movement to its pose subsequent to the movement. The controller may then use the correlation function to determine a change in the coupling coefficient of the wireless resonant coupling link based on the change in the pose of the receiver. In particular, the controller my use the correlation function to estimate, based on the change in the pose of the receiver, a second coupling coefficient subsequent to the movement.

The controller may then use the estimated coupling coefficient to determine an adjustment to the impedance of the impedance matching networks. Using the estimated coupling coefficient allows the controller to transfer power more efficiently than determining the coupling coefficient based on the system parameters. The increased efficiency may be due to the controller estimating the coupling coefficient at a faster rate than calculating the coupling coefficient based on reflected impedance. Increasing the rate at which the controller determines the coupling coefficient may allow the controller to accelerate the process of updating the operating parameters of the wireless power system.

After the controller has updated the operating parameters, the controller may precisely determine the coupling coefficient in order to further increase the efficiency of the wireless power transfer. The controller may determine to calculate the coupling coefficient based on the efficiency of the wireless power transfer. If the efficiency is below a predetermined efficiency, the controller may determine to calculate the coupling coefficient more precisely. On the other hand, if the efficiency is above a predetermined efficiency, the controller may determine not to calculate the coupling coefficient.

In an embodiment, the controller may determine the coupling coefficient more precisely based on power reflected from the receiver, e.g., using the process described above. Alternatively, the controller may determine the coupling coefficient based on the estimated coupling coefficient. In particular, the controller may set up the problem of determining the coupling coefficient from the estimated coupling coefficient as an optimization problem. The controller may then use numerical methods to determine the coupling coefficient from the estimated coupling coefficient. The controller may then adjust the impedance of the impedance matching network based on the determined coupling coefficient, if necessary.

In another embodiment, the controller may maintain the power received by the receiver at a constant level by adjusting the power that is transmitted by the transmitter and the impedance matching network. Thus, both impedance and power control may be used to control the power received by the receiver. For instance, adjusting the impedance of the impedance matching network may adjust the received power to near the desired power. The controller may determine that it more efficient to adjust the power transmitted by the transmitter rather than calculating the coupling coefficient more precisely. Accordingly, the controller may adjust the power transmitted by the transmitter. In some examples, the power that is transmitted by the transmitter may be continuously or almost continuously variable as a receiver moves in the environment. On the other hand, the impedance of the impedance matching networks may be step-wise variable.

In some situations, using the coupling coefficient to determine the pose may result in several possible poses that correspond to the coupling coefficient. Accordingly, the controller may use further methods to more precisely determine the pose of the receiver. A method that may be used to more precisely determine the pose of the receiver includes using predetermined or known transmitter configurations to determine the pose of the receiver more accurately. In the scenario where using the coupling coefficient results in several possible poses, the method may be used to determine the actual pose of the receiver from the possible poses. In this method, the controller may operate the transmitter at one or more known transmitter configurations, and may then monitor changes in the coupling coefficient as the transmitter operates at each of the configurations. By increasing the number of data points (i.e., coupling coefficient values), the controller may determine the pose of the receiver more accurately by narrowing the possible poses to a single pose.

In some embodiments, the transmitter may also be moveable. In such embodiments, the controller may determine a configuration of the transmitter in order to increase the efficiency of the wireless power transfer to a receiver. By way of example, the controller may determine a configuration of the transmitter that increases the coupling between the transmitter and the receiver, which may increase the strength of the wireless resonant coupling link that couples the transmitter and the receiver. In an embodiment, the controller may adjust the pose of the transmitter to increase the coupling between the transmitter and the receiver. Adjusting the pose of the transmitter may include adjusting the location and/or orientation of the transmitter. In examples where the transmitter is fixed, the controller may adjust the pose of the transmitter by adjusting the orientation of the transmitter. The fixed transmitter may be mounted on an adjustable mount. Adjusting the adjustable mount may change the orientation of the receiver in the environment. Examples of adjustable mounts include gimbals, turrets, stepper motor mounts, rotational mounts, motorized mounts, etc.

Figure 12:
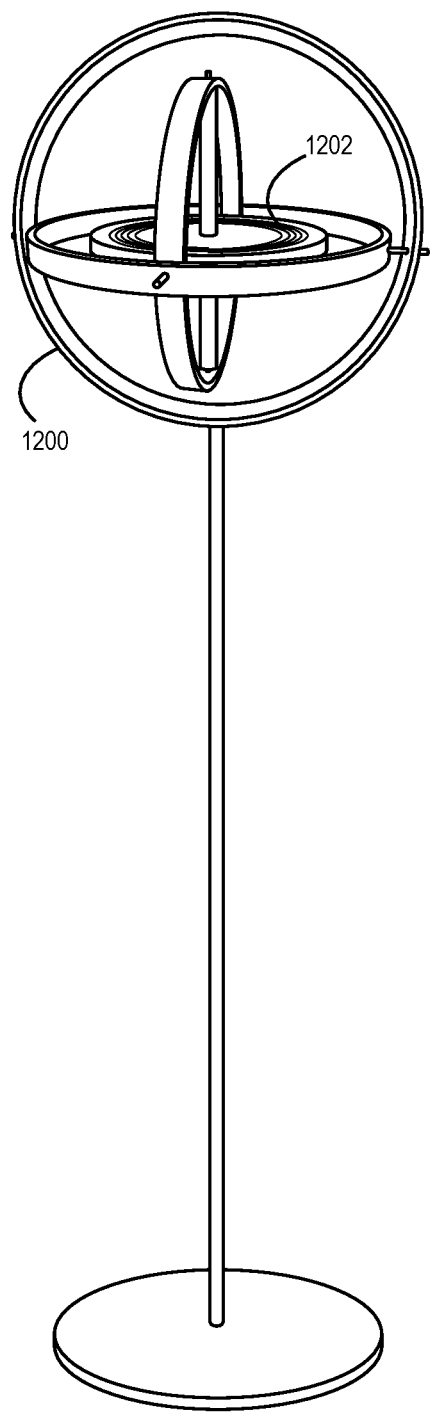
FIG. 12 illustrates a wireless power transmitter mounted onto a gimbal, according to an example embodiment.

FIG. 12 illustrates a transmitter 1202 that is mounted on a gimbal 1200, according to an exemplary embodiment. The controller of the wireless power system may determine an orientation of the transmitter 1202 that increases the coupling between the transmitter 1202 and a receiver (not illustrated). The controller may then adjust the orientation of the gimbal 1200 such that the transmitter is oriented according to the determined orientation. The controller may then determine whether the coupling coefficient between the transmitter and the receiver increased. Based on the determination, the controller may reiterate the process of determining an orientation of the transmitter. In an embodiment, the controller may determine whether to adjust the orientation of the transmitter after each movement of the receiver. In yet other embodiments, the controller may determine an adjustment to the pose of the receiver that may increase the coupling coefficient. As such, the controller may determine an adjustment to the pose of the transmitter and/or the receiver in order to increase the coupling coefficient.

In another embodiment, the transmitter may include a phased array antenna that may be configured to generate an oscillating near field signal providing the wireless resonant coupling link. The phased array antenna may include a plurality of transmit-resonator coils. Such a phased array antenna may be configurable to generate an oscillating near field signal that propagates in a particular direction. The controller may determine a desired configuration for the phased array antenna based on the coupling between the transmitter and the receiver. By way of example, the controller may determine a direction in which the transmitter may direct the oscillating near field signal such that the coupling between the transmitter and the receiver is increased, optimized, or otherwise adjusted.

The controller may then determine a configuration of the phased array antenna at which to operate the phased array antenna such that phased array antenna directs the oscillating near field signal towards the determined direction. In some examples, the configuration of the phased array antenna may be a geometrical configuration that arranges the plurality of transmit-resonators in a particular orientation that directs the oscillating near field signal towards the determined direction. Additionally and/or alternatively, the configuration of the phased array antenna may be a respective phase at which each transmit-resonator transmits the oscillating near field signal. Within examples, the phased array antenna may be a linear array, a planar array, or a conformal phased array antenna. Other examples of antennas are possible.

D. Indoor Positioning System

IMUs or other navigation systems may be used as part of indoor positioning systems that track the location of one or more devices to which the IMUs are coupled. For example, an IMU may be coupled to an autonomous vehicle disposed in a warehouse. However, while an accelerometer and gyroscope may be effective at determining the orientation of the device to which they are coupled, slight errors in measurement may compound over time and result in a more significant error. Such errors cause "drift," which is the increasing difference between the actual location of the device and the location that is indicated by the data. As such, using an IMU or other sensors that generate kinematic data for localization of devices may result in inaccurate location data.

In an embodiment, a more accurate indoor positioning system may include a kinematic sensor, a wireless power transmitter, and a wireless power receiver. The wireless power receiver may be coupled to another device (e.g., an autonomous forklift). As explained above, a controller may determine the pose of a wireless power receiver based on (i) a coupling coefficient of a wireless resonant coupling link coupling the transmitter and the receiver, and (ii) kinematic data received from a sensor coupled to the receiver. In an embodiment, a controller of an indoor positioning system may use the coupling coefficient and the kinematic data in order to determine the location of the device to which the wireless power receiver is coupled.

In some examples, the wireless power receiver may be coupled to the device in order to supply the device with electrical power. In such examples, in addition to supplying the device with power, the wireless power receiver may be part of an indoor positioning system that indicates determines the position of the device in the environment. In other examples, the wireless power receiver may be a low-power wireless receiver that is configured for use in the indoor positioning system, and not necessarily configured to supply the device with electrical power. The low-power wireless receiver may receive a small amount of power that may allow the controller to determine a coupling coefficient of the wireless resonant coupling link that couples the transmitter and the receiver.

Figure 13:
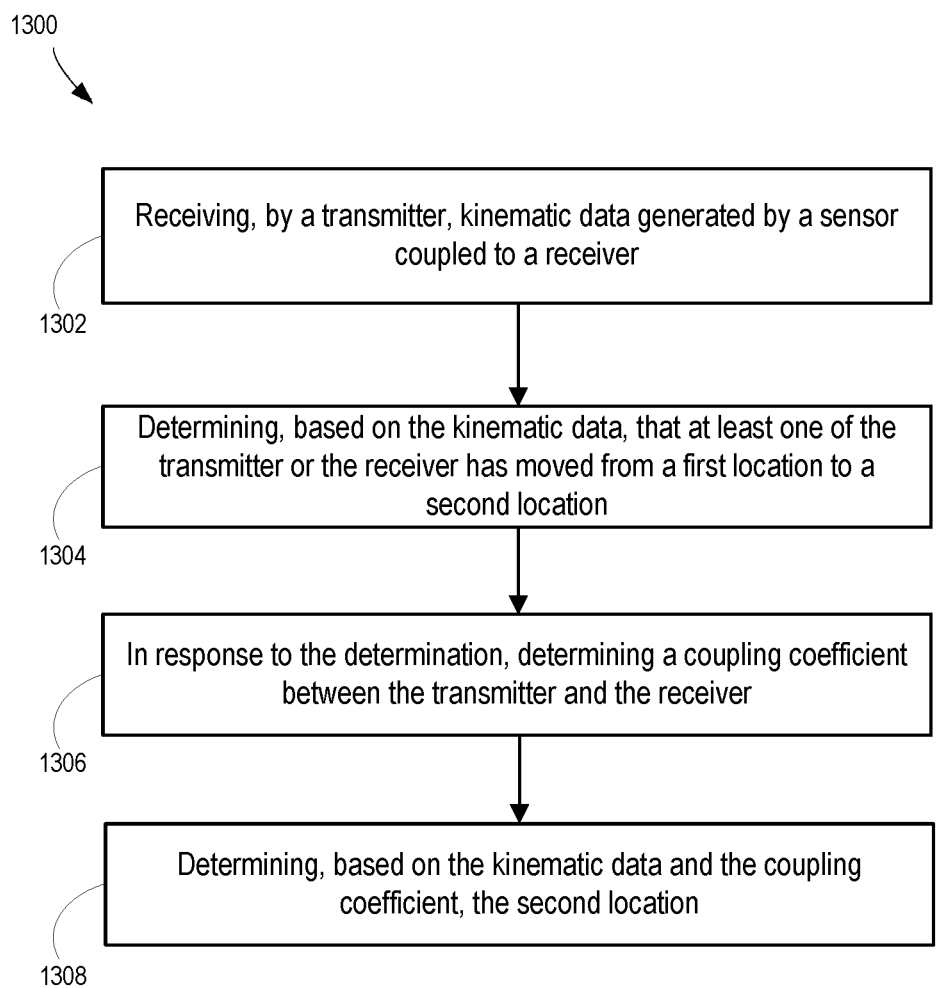
FIG. 13 illustrates a method of determining a location of a device in an environment, according to an example embodiment.

FIG. 13 illustrates a flowchart showing a method 1300 that may determine location of a moving receiver, according to an exemplary embodiment. In some embodiments, the method 1300 may be carried out by the controller of the wireless power system. In other embodiments, the method 1300 may be carried out by the controller of the indoor positioning system.

As noted above, the functionality described in connection with the flowcharts described herein can be implemented as special-function and/or configured general-function hardware modules, portions of program code executed by one or more processors for achieving specific logical functions, determinations, and/or steps described in connection with the flowchart shown in FIG. 13. For example the one or more processors may be part of controller 134 of FIG. 1. Where used, the program code can be stored on any type of non-transitory computer-readable medium, for example, such as a storage device including a disk or hard drive.

In addition, each block of the flowchart shown in FIG. 13 may represent circuitry that is wired to perform the specific logical functions in the process. Unless specifically indicated, functions in the flowchart shown in FIG. 13 may be executed out of order from that shown or discussed, including substantially concurrent execution of separately described functions, or even in reverse order in some examples, depending on the functionality involved, so long as the overall functionality of the described method is maintained.

As shown by block 1302 of FIG. 13, the method 1300 includes receiving, by a transmitter, kinematic data generated by a sensor coupled to a receiver. In an example, the receiver may be coupled to a device, such as an autonomous forklift that is deployed in a warehouse. The receiver may be part of an indoor positioning system. The receiver may also be coupled to a wireless power transmitter that may be located in the warehouse. The wireless power receiver may or may not be configured to provide the forklift with power. Further, the sensor may be an IMU, and the kinematic data may be IMU data.

Further, at block 1304, the method 1300 includes determining, based on the kinematic data, that at least one of the transmitter or the receiver has moved from a first location to a second location. For example, the controller of the indoor positioning system may determine based on acceleration data received from the sensor that the forklift moved from a first location in the warehouse to a second location.

Further, at block 1306, the method 1300 includes in response to the determination, determining a coupling coefficient between the transmitter and the receiver. The controller of the indoor positioning system may determine the coupling coefficient of the wireless coupling link coupling the transmitter and the receiver using any of the methods described herein. Finally, at block 1308, the method 1300 includes determining, based on the kinematic data and the coupling coefficient, the second location.

In an embodiment, the indoor positioning system may generate a coverage map of the wireless power system in an environment. The coverage map may be indicative of the strength of the wireless resonant coupling link in the environment. In particular, the indoor positioning system may use the coupling coefficient of a receiver at a location in order to determine a strength of the wireless resonant coupling link at the location. In some examples, the indoor positioning system may include a mobile low-power wireless receiver. The mobile receiver may be configured to move in the environment to collect data, such as the coupling coefficient at different locations in the environment. The controller may then generate the coverage map of the wireless power system based on the data that is collected by the mobile low-power wireless receiver. The coverage map may accessible to a user and may illustrate the lossy parts of the environment. Other uses of the coverage map are also possible. For example, the controller may determine, based on the coverage, how to increase the coupling between the transmitter and one or more receivers in the environment.

III. Conclusion

While various aspects and embodiments have been disclosed herein, other aspects and embodiments will be apparent to those skilled in the art. The various aspects and embodiments disclosed herein are for provided for explanatory purposes and are not intended to be limiting, with the true scope being indicated by the following claims.

The invention claimed is:

1. A method comprising:
determining a reflected impedance from a receiver to a transmitter based on power transmitted from the transmitter to the receiver, wherein the receiver and transmitter are coupled via a wireless resonant coupling link, and wherein the receiver is disposed at a first location;
calculating a first coupling coefficient between the transmitter and the receiver based at least in part on the reflected impedance;
receiving, by the transmitter, kinematic data, wherein the kinematic data is generated by a sensor coupled to the receiver; and
determining, based on the kinematic data and the first coupling coefficient, the first location.

2. The method of claim 1, wherein the sensor coupled to the receiver is an inertial measurement unit (IMU), wherein the kinematic data is IMU data, wherein the IMU data is indicative of a pose of the receiver, and wherein the pose of the receiver is indicative of at least one of a position and an orientation of the receiver with respect to a reference frame.

3. The method of claim 1, further comprising:
receiving, by the transmitter, first information indicative of electrical energy received at the receiver from the transmitter via the wireless resonant coupling link.

4. The method of claim 3, further comprising:
detecting a change in the electrical energy received at the receiver;
determining, based on the kinematic data, that the receiver has moved to a second location;
estimating, based at least on the second location and the first coupling coefficient, a second coupling coefficient between the transmitter and the receiver;
calculating, based on the estimated second coupling coefficient, an adjustment to an impedance of one or more impedance matching networks, wherein each of the impedance matching networks is coupled to at least one of the transmitter or the receiver; and
adjusting the impedance of the one or more impedance matching networks according to the calculated adjustment.

5. The method of claim 4, wherein estimating, based on the second location and the first coupling coefficient, a second coupling coefficient comprises:
using a correlation function to estimate a change in coupling between the transmitter and the receiver when the receiver moves from the first position to the second position, wherein the correlation function correlates a change in location of the receiver to the change in coupling.

6. The method of claim 5, wherein the correlation function is a seven entry lookup table (LUT), wherein the seven entries of the LUT are: three receiver position entries, three receiver orientation entries, and a coupling mode entry, and wherein an output of the LUT is an estimate of the second coupling coefficient.

7. The method of claim 4, wherein using a correlation function to estimate a change in coupling comprises:
generating the correlation function based on at least one of: a pose of the transmitter, a pose of the receiver, a geometry of a transmit-resonator coupled to the transmitter, a geometry of a receive-resonator coupled to the receiver, and a coupling mode of the transmitter and the receiver.

8. The method of claim 3, further comprising:
receiving, by the transmitter, second information indicative of a reflected signal; and
based on the estimated second coupling coefficient and the second information, calculating the second coupling coefficient.

9. The method of claim 2, further comprising:
detecting a change in the electrical energy received at the receiver;
determining, based on the kinematic data, that the location of the receiver is unchanged; and
in response to the determination, determining that an unintended recipient is present.

10. The method of claim 9, further comprising:
adjusting an impedance of one or more impedance matching networks, wherein each of the impedance matching networks is coupled to at least one of the transmitter or the receiver, so as to reduce or eliminate provision of electrical power to the unintended recipient.

11. The method of claim 1, wherein determining the reflected impedance comprises:
receiving, via a bidirectional coupler coupled to the transmitter, second information indicative of a reflected signal from a load coupled to the receiver; and
determining an impedance of the load based on the second information.

12. The method of claim 1, further comprising:
based on the first location, determining a transmitter configuration that increases a coupling strength of the wireless resonant coupling link; and
operating the transmitter according to the determined transmitter configuration.

13. The method of claim 12, wherein the transmitter is mechanically coupled to an adjustable mount, and wherein determining a transmitter configuration comprises:
determining an orientation of the adjustable mount that orients the transmitter so as to increase the coupling strength of the wireless resonant coupling link; and
adjusting the adjustable mount according to the determined orientation.

14. The method of claim 12, wherein the transmitter comprises a phased array antenna, and wherein determining a transmitter configuration comprises:
determining a desired configuration of the phased array based on the coupling between the transmitter and the receiver; and
operating the phased array antenna according to the determined desired configuration.

15. A system comprising:
a transmitter;
a receiver disposed at a first location, wherein the receiver is coupled to the transmitter via a wireless resonant coupling link, wherein the receiver is operable to receive electrical energy from the transmitter via the wireless resonant coupling link;
a first sensor configured to generate kinematic data;
one or more impedance matching networks; and
a controller comprising at least one processor and a memory, wherein the at least one processor executes instructions stored in the memory so as to carry out operations, the operations comprising:
determining a reflected impedance from the receiver to the transmitter based on power transmitted from the transmitter to the receiver;
calculating a first coupling coefficient between the transmitter and the receiver based at least in part on the reflected impedance;
receiving, by the transmitter, the kinematic data; and
determining, based on the kinematic data and the first coupling coefficient, the first location.

16. The system of claim 15, further comprising:
a second sensor coupled to the receiver, wherein the second sensor is operable to generate information indicative of electrical energy received at the receiver from the transmitter via the wireless resonant coupling link, and wherein the receiver is configured to transmit the generated information to the transmitter.

17. The system of claim 16, wherein the operations further comprise:
detecting a change in the electrical power received at the receiver;
determining, based on the kinematic data, that the receiver has moved to a second location;
estimating, based on the second location and the first coupling coefficient, a second coupling coefficient between the transmitter and the receiver located at the second location;
calculating, based on the estimated second coupling coefficient, an adjustment to an impedance of one or more impedance matching networks, wherein each of the impedance matching networks is coupled to at least one of the transmitter and the receiver; and
adjusting the impedance of the one or more impedance matching networks according to the calculated adjustment.

18. The system of claim 15, further comprising an adjustable mount, wherein the transmitter is mechanically coupled to the adjustable mount, and wherein the operations further comprise:
determining an orientation of the adjustable mount that orients the transmitter so as to increase the strength of the wireless resonant coupling link; and
adjusting the adjustable mount according to the determined orientation.

19. The system of claim 15, further comprising a bidirectional coupler coupled to the transmitter, wherein the bidirectional coupler is configured to receive second information indicative of a reflected signal from a load coupled to the receiver, and wherein determining the reflected impedance comprises:
determining an impedance of the load based on the second information.

20. The system of claim 15, wherein the transmitter comprises at least one transmit resonator, wherein the at least one transmit resonator comprises at least one of: a transmit inductor or at least one transmit capacitor, wherein the at least one transmit capacitor is at least a transmit common mode capacitor, wherein the transmit common mode capacitor comprises a transmitter conductor and a ground reference, wherein the at least one transmit resonator is configured to resonate at one or more transmitter resonance frequencies, wherein the one or more transmitter resonance frequencies comprise at least the oscillation frequency, and
wherein the receiver comprises at least one receive resonator, wherein the at least one receive resonator comprises at least one of: a receive inductor or at least one receive capacitor, wherein the at least one receive capacitor is at least a receive common mode capacitor, wherein the receive common mode capacitor comprises a receiver conductor and the ground reference, wherein the at least one receive resonator is configured to resonate at one or more receiver resonance frequencies, wherein the one or more receiver resonance frequencies comprise at least one of the one or more transmitter resonance frequencies, and wherein the at least one receive resonator is operable to be coupled to the transmit resonator via the wireless resonant coupling link.

21. A method comprising:

determining a reflected impedance from a receiver to a transmitter based on power transmitted from the transmitter to the receiver, wherein the receiver and transmitter are coupled via a wireless resonant coupling link;

calculating a coupling coefficient between the transmitter and the receiver based at least in part on the reflected impedance;

receiving, by the transmitter, kinematic data generated by a sensor coupled to the receiver;

determining, based on the kinematic data, that at least one of the transmitter or the receiver has moved from a first location to a second location;

in response to the determination, re-determining the coupling coefficient between the transmitter and the receiver; and determining, based on the kinematic data and the re-determined coupling coefficient, the second location.

22. The method of claim 21, wherein determining, based on the kinematic data and the re-determined coupling coefficient, the second location comprises:

using a correlation function to determine the second location, wherein the correlation function correlates a change in the coupling coefficient to a change in position of at least one of the transmitter or the receiver.

23. The method of claim 21, wherein determining the second location comprises:

sequentially operating the transmitter at one or more predetermined configurations;

as the transmitter operates in each configuration, determining a respective coupling coefficient between the transmitter and the receiver; and determining, based on the respective coupling coefficients and the kinematic data, the second location.

* * * * *